United States Patent
Yoshida

(10) Patent No.: US 6,844,917 B2
(45) Date of Patent: Jan. 18, 2005

(54) METHOD OF DETERMINING MOVEMENT SEQUENCE AND APPARATUS FOR REALIZING IT

(75) Inventor: Koji Yoshida, Kanagawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/423,956

(22) Filed: Apr. 28, 2003

(65) Prior Publication Data

US 2004/0051057 A1 Mar. 18, 2004

Related U.S. Application Data

(62) Division of application No. 09/031,514, filed on Feb. 27, 1998, now Pat. No. 6,576,919.

(30) Foreign Application Priority Data

Feb. 28, 1997 (JP) ............................................. 9-46109
Feb. 18, 1998 (JP) ............................................ 10-35964

(51) Int. Cl.$^7$ ............................................................ G03B 27/42
(52) U.S. Cl. ...................................................... 355/53
(58) Field of Search .......................... 355/53; 250/548, 250/234; 700/121

(56) References Cited

U.S. PATENT DOCUMENTS

| | | | |
|---|---|---|---|
| 4,488,806 A | * | 12/1984 | Takahashi et al. ............. 355/77 |
| 4,677,301 A | | 6/1987 | Tanimoto et al. |
| 4,780,617 A | | 10/1988 | Umatate et al. |
| 4,823,012 A | | 4/1989 | Kosugi |
| 5,200,677 A | | 4/1993 | Dueck et al. |
| 5,243,665 A | | 9/1993 | Maney et al. |
| 5,337,247 A | | 8/1994 | Hamaguchi |
| 5,526,093 A | * | 6/1996 | Takahashi ..................... 355/53 |
| 5,654,792 A | * | 8/1997 | Yonekawa ..................... 355/53 |

FOREIGN PATENT DOCUMENTS

| | | |
|---|---|---|
| EP | 525 497 A1 | 2/1993 |
| EP | 753 796 A1 | 1/1997 |
| JP | 61-44429 | 3/1986 |

OTHER PUBLICATIONS

Uzsoy, et al., "A Review of Production Planning and Scheduling Models in the Semiconductor Industry", *IIE Transactions*, vol. 24, No. 4, Sep. 1992, pp. 47–60.

(List continued on next page.)

*Primary Examiner*—Rodney Fuller

(57) ABSTRACT

A movement sequence determining method of obtaining a preferred solution of movement sequence within a predetermined time and an apparatus for realizing it, includes at least an arithmetic step of generating a group including plural movement sequences that can be carried out, out of a group of movement sequence candidates, each indicating a visit order of plural process areas as well as scan directions of local areas in the plural process areas, and selecting a movement sequence in which a movement operation between plural process areas is completed in a shortest time, from the group generated, and a prestep of producing a movement time management table storing movement times, each from a movement start position to a movement end position, in unit lengths between process areas.

24 Claims, 28 Drawing Sheets

OTHER PUBLICATIONS

Uzsoy, et al., "A Review of Production Planning and Scheduling Models in the Semiconductor Industry", *IIE Transactions*, vol. 26, No. 5, Sept. 1994, pp 44–55.

Y. Nagata et al., "A New Crossover for TSP Taking Account of A Tradeoff between Characteristic–preservingness and Degree of freedom of Crossover", (1996), pp 25–30.

S. Lin, et al., "An Effective Heuristic Algorithm for the Traveling Salesman Problem", (Oct. 1971), pp. 498–516.

L. Davis, "Applying Adaptive Algorithms to Epistatic Domains", (1985), pp. 162–164.

H. Satoh et al., "Minimal Generation Gap Model for Gas Considering Both Exploration and Exploitation", (1996), pp. 494–497.

Operations Research 39, "Practical course: Invitation to traveling–salesman problems I", pp. 25–31, (Mar. 1994).

Operations Research 39, Practical course: Invitation to traveling–salesman problems II, pp. 91–96, (Mar. 1994).

Operations Research 39, Practical course: Invitation to traveling–salesman problems III, pp. 91–96, (Mar. 1994).

* cited by examiner

| ATTRIBUTE | | PARAMETER | SETTING |
|---|---|---|---|
| START POINT OF WAFER STAGE | | ESx<br>ESy (mm) | 50<br>50 |
| END POINT OF WAFER STAGE | | EEx<br>EEy (mm) | 30<br>300 |
| ACCELERATION OF<br>WAFER STAGE | (X DIRECTION)<br>(Y DIRECTION) | AWX<br>AWY | 0.2g<br>0.34g |
| MAX SPEED OF<br>WAFER STAGE | (X DIRECTION)<br>(Y DIRECTION) | VWMAX_X<br>VWMAX_Y | 200mm/sec<br>270mm/sec |
| ACCELERATION OF RETICLE STAGE | | AR | 0.56g |
| MAX SPEED OF RETICLE STAGE | | VRMAX | 600mm/sec |
| SETTING TIME | | TSE | 0.036sec |
| NUMBER OF CHIPS | | N | 26 | g: ACCELERATION OF GRAVITY (=9.80m/sec)

FIG. 4

| CHIP AREA | COORDINATES OF CENTER | | CONSTRAINT ON SCAN DIRECTION | CHIP AREA | COORDINATES OF CENTER | | CONSTRAINT ON CHIP DIRECTION |
|---|---|---|---|---|---|---|---|
| | X | Y | | | X | Y | |
| A | 100 | 100 | BACK | N | 150 | 166 | ANY |
| B | 125 | 100 | ANY | O | 175 | 166 | ANY |
| C | 150 | 100 | ANY | P | 200 | 166 | ANY |
| D | 175 | 100 | BACK | Q | 75 | 199 | FORE |
| E | 75 | 133 | BACK | R | 100 | 199 | ANY |
| F | 100 | 133 | ANY | S | 125 | 199 | ANY |
| G | 125 | 133 | ANY | T | 150 | 199 | ANY |
| H | 150 | 133 | ANY | U | 175 | 199 | ANY |
| I | 175 | 133 | ANY | V | 200 | 199 | FORE |
| J | 200 | 133 | BACK | W | 100 | 232 | FORE |
| K | 75 | 166 | ANY | X | 125 | 232 | ANY |
| L | 100 | 166 | ANY | Y | 150 | 232 | ANY |
| M | 125 | 166 | ANY | Z | 175 | 232 | FORE |

FIG. 5

| | START(+) | START(-) | A(+) | A(-) | B(+) | B(-) | ... | Y(+) | Y(-) | Z(+) | Z(-) |
|---|---|---|---|---|---|---|---|---|---|---|---|
| A(+) | X | X | X | X | X | X | | X | X | X | X |
| A(-) | 0.326994 | 0.487844 | X | X | 0.159665 (F1) | 0.487844 | | 0.476296 | 0.487844 | 0.476296 | X |
| B(+) | 0.487844 | 0.375 | X | 0.159665 | X | X | | 0.759913 | 0.501481 | 0.759913 | X |
| B(-) | 0.375 | 0.487844 | X | 0.487844 | X | X | | 0.476296 | 0.487844 | 0.476296 | X |
| ... | | | | | | | | | | | |
| Y(+) | 0.532266 | 0.532266 | X | | 0.476296 | 0.476296 | | X | X | 0.487844 | X |
| Y(-) | 0.815883 | 0.815883 | X | 0.759913 | 0.501481 | 0.759913 | | X | 0.159665 | 0.159665 | X |
| Z(+) | 0.625 | 0.625 | X | 0.476296 | 0.487844 | 0.476296 | | 0.487844 | X | X | X |
| Z(-) | X | X | X | X | X | X | | X | X | X | X |
| END(+) | X | X | X | 0.869957 | 0.611525 | 0.869957 | | 0.6 | 0.6 | 0.725 | X |
| END(-) | X | X | X | 0.869957 | 0.611525 | 0.869957 | | 0.6 | 0.6 | 0.725 | X |

(UNIT : SEC)

FIG. 7

| CHIP AREA | COORDINATES (X,Y) OF CENTER | CONSTRAINT ON SCAN DIRECTION | CHIP AREA | COORDINATES (X,Y) OF CENTER | CONSTRAINT ON SCAN DIRECTION |
|---|---|---|---|---|---|
| START | (50,50) | ANY | 40 | (75,232) | ANY |
| 01 | (100,100) | BACK | 41 | (100,232) | ANY |
| 02 | (125,100) | BACK | 42 | (125,232) | ANY |
| 03 | (150,100) | ANY | 43 | (150,232) | ANY |
| 04 | (175,100) | ANY | 44 | (175,232) | ANY |
| 05 | (200,100) | ANY | 45 | (200,232) | ANY |
| 06 | (225,100) | ANY | 46 | (225,232) | ANY |
| 07 | (250,100) | BACK | 47 | (250,232) | ANY |
| 08 | (275,100) | BACK | 48 | (275,232) | ANY |
| 10 | (75,133) | BACK | 49 | (300,232) | ANY |
| 11 | (100,133) | ANY | 50 | (75,265) | ANY |
| 12 | (125,133) | ANY | 51 | (100,265) | ANY |
| 13 | (150,133) | ANY | 52 | (125,265) | ANY |
| 14 | (175,133) | ANY | 53 | (150,265) | ANY |
| 15 | (200,133) | ANY | 54 | (175,265) | ANY |
| 16 | (225,133) | ANY | 55 | (200,265) | ANY |
| 17 | (250,133) | ANY | 56 | (225,265) | ANY |
| 18 | (275,133) | ANY | 57 | (250,265) | ANY |
| 19 | (300,133) | BACK | 58 | (275,265) | ANY |
| 20 | (75,166) | ANY | 59 | (300,265) | ANY |
| 21 | (100,166) | ANY | 60 | (75,298) | FORE |
| 22 | (125,166) | ANY | 61 | (100,298) | ANY |
| 23 | (150,166) | ANY | 62 | (125,298) | ANY |
| 24 | (175,166) | ANY | 63 | (150,298) | ANY |
| 25 | (200,166) | ANY | 64 | (175,298) | ANY |
| 26 | (225,166) | ANY | 65 | (200,298) | ANY |
| 27 | (250,166) | ANY | 66 | (225,298) | ANY |
| 28 | (275,166) | ANY | 67 | (250,298) | ANY |
| 29 | (300,166) | ANY | 68 | (275,298) | ANY |
| 30 | (75,199) | ANY | 69 | (300,298) | FORE |
| 31 | (100,199) | ANY | 71 | (100,331) | FORE |
| 32 | (125,199) | ANY | 72 | (125,331) | FORE |
| 33 | (150,199) | ANY | 73 | (150,331) | ANY |
| 34 | (175,199) | ANY | 74 | (175,331) | ANY |
| 35 | (200,199) | ANY | 75 | (200,331) | ANY |
| 36 | (225,199) | ANY | 76 | (225,331) | ANY |
| 37 | (250,199) | ANY | 77 | (250,331) | FORE |
| 38 | (275,199) | ANY | 78 | (275,331) | FORE |
| 39 | (300,199) | ANY | END | (30,350) | ANY |

FIG. 26

METHOD OF DETERMINING MOVEMENT SEQUENCE AND APPARATUS FOR REALIZING IT

CROSS-REFERENCE TO RELATED APPLICATIONS

This application is a divisional of U.S. patent application Ser. No. 09/031,514, filed Feb. 27, 1998 and now U.S. Pat. No. 6,576,919, the disclosure of which is incorporated herein by reference, which claims the benefit of Japanese Patent Application Nos. 09-046109 and 10-035964, correspondingly filed Feb. 28, 1997 and Feb. 18, 1998, in the Japanese Patent Office.

BACKGROUND OF THE INVENTION

1. Field of the Invention

The present invention relates to control of movement of a wafer stage in one-shot exposure type exposure apparatus (including step-and-repeat type steppers), control of movement of the wafer stage and a reticle stage in exposure apparatus for performing the exposure operation in the reticle scanning method (including step-and-scan type steppers), and control of movement of the wafer stage and a sensor stage in wafer inspecting apparatus for performing inspection in the sensor scanning method and, more particularly, to a method of minimizing the overall turnaround time of stage movement for sequential exposure processes or sequential inspection processes in these apparatus.

2. Related Background Art

For carrying out processes such as exposures or inspections in a wafer provided with plural chip areas, higher production efficiency or inspection efficiency thereof is preferred. Particularly, focusing attention on movement of the stage upon change of chip areas being objects in the predetermined process such as exposure or inspection, the overall turnaround time necessary for the movement of stage through the all chip areas on the wafer needs to be shortened as much as possible. For that, the order of exposures or inspections or the like in the n(n>1) chip areas (i.e., a visit order of the chip areas) needs to be optimized so as to minimize the overall turnaround time necessary for the movement of stage.

For example, supposing that in a one-shot exposure type stepper there are n chip areas to be exposed on the wafer, a conceivable number of movements of the stage between the chip areas is at most $_nP_2=n(n-1)$ (even under the condition that the turnaround time differs depending upon whether the direction of movement of the stage is positive or negative). Accordingly, once the exposure order or the inspection order of the all chip areas is determined, the overall turnaround time necessary for the movement of stage can be obtained uniquely and in short time. However, since there exists n! ways as to the orders for carrying out the exposures, inspections, or the like of the n chip areas, inordinate time is required for producing and checking all conceivable orders and for computing all applicable solutions. Particularly, when n>13, it is practically impossible ("Practical course: Invitation to traveling-salesman problems I, II, III," Operations Research 39 (1994), No. 1: pp 25–31, No. 2: pp 91–96, No. 3: pp 156–162).

Further, in the case of the apparatus for carrying out scanning exposure or scanning inspection, typified by the scan exposure type steppers, the reticle stage (or a sensor stage) and the wafer stage need to be controlled in synchronism upon carrying out the exposure, inspection, or the like for each shot area (equivalent to the chip area) on the wafer, and there are degrees of freedom as to scan directions in each shot area. Therefore, the exposure order (exposure sequence) for the all shot areas and the scan directions of local areas (for example, areas successively becoming exposure objects) in the respective shot areas must be optimized simultaneously. The number of conceivable exposure sequences or inspection sequences (either of which is included in the movement sequence) is given by the product of the number of combinations with the scan directions of local areas in the respective n shot areas (if the degrees of freedom of the scan directions are m, the number of combinations is $m^n$) and the number of permutation of exposures (or inspections) of the n shot areas (n!), i.e., $m^n \times n!$. It is thus more difficult to obtain an optimum solution of movement sequence than in the case of the one-shot exposure type steppers.

In the conventional apparatus described above, therefore, optimum simultaneous control sequences of the wafer stage and reticle stage to minimize the turnaround time of exposure sequence under specific conditions anticipated are preliminarily set in order to shorten the time for successive exposures of plural areas on the wafer within practical computation time. When an actual operation condition does not suit the above specific conditions, only an unfit portion of the optimum simultaneous control sequences preset is modified so as to fit the above specific conditions. Accordingly, recomputation of optimum movement sequences is not carried out each time in the practical operations.

SUMMARY OF THE INVENTION

The inventor examined the conventional technology described above and found the following problems.

First, the conventional apparatus such as the one-shot exposure type steppers cannot obtain an optimum or near-optimum solution to a permutational optimization problem within short time. An ideally preferred way is such that movement sequences to indicate orders of exposures, inspections, or the like in the chip areas are generated and examined and among them a movement sequence having the shortest time is determined as a solution of movement sequence to be found. However, studying what order should be employed for the exposures, inspections, or the like in the n chip areas provided on the wafer, even the one-shot exposure type steppers require examination of n! movement sequences for only exposure orders or inspection orders of n chip areas. In particular, when n>13, inordinate time is consumed for the computation of solution so that it practically seems impossible to obtain the solution. Therefore, for increasing the throughput, effective generation of optimum or near-optimum solution is necessary as to the exposure order or inspection order.

Second, the conventional apparatus such as the steppers of the scan exposure type requires more considerable time for obtaining the optimum or near-optimum solution to the composite problem of the permutational optimization problem with the combinatorial optimization problem. Since the apparatus for carrying out the scanning exposure or scanning inspection, typified by the scan exposure type steppers, has the degrees of freedom as to the exposure order or the inspection order of each chip area on the wafer and as to the scan directions of local areas in the respective chip areas, simultaneous optimization of these must also be considered. Since the optimization of exposure sequence and the optimization of scan direction on the wafer are correlated with each other, they cannot be so managed that the optimization of scan direction is carried out after the optimum solution of exposure sequence has been obtained. Conversely, they cannot be so managed that the optimization of exposure sequence is carried out after the optimum solution of scan direction has been obtained, either. In this case, the number of combinations of permissible scan directions for the all n chip areas is the n-th power of the degrees of freedom of scan directions: m (e.g., m=2 in the scan exposure type steppers); concerning movement sequences of two stages taking account of both movement of the wafer stage and movement of the reticle stage or the sensor stage (scanning of local area in each chip area), the number of conceivable movement sequences is $m^n \times n!$. It is thus practically impossible to perform generation of the all movement sequences or to perform all probable inspections. In order to increase the throughput, efficient generation is also necessary for the optimum or near-optimum solution of exposure sequence.

Third, the above problems must be solved even if the user gives an instruction of an arbitrary constraint in practical operations. Examples of the constraint given by the user include such constraints that no exposure should be effected in one shot area or two or more shot areas (process object regions) selected by the user, that the scan direction in one shot area or two or more shot areas selected by the user should follow the instruction given by the user, and so on. In practical operations the above problems must be solved even under the operation conditions to which the arbitrary constraint is added, as described. In the operation of the above conventional apparatus, however, even if such a constraint is given, a corrective solution to satisfy the constraint thus added is generated by partly modifying a solution of exposure sequence preliminarily obtained under the specific conditions. This provides no guarantee that the corrective solution generated is optimum or good in quality under the above arbitrary constraint condition. Accordingly, in order to increase the throughput, even if the user gives the instruction of the arbitrary constraint, it is necessary to develop and apply an algorithm for efficiently generating the optimum or near-optimum solution, as described in the foregoing description of problem, out of constraint-satisfying solutions (feasible basic solutions) satisfying the constraint.

Fourth, in practical operations, a trade-off needs to be taken into account between the allowed computation time for generating the optimum or near-optimum solution, and the quality of solution generated. In the case of the apparatus for carrying out the scanning exposure or the scanning inspection, typified by the scan exposure type steppers, in order to determine the exposure sequence of each chip area, the object is only to find an approximate solution within short time limited because of enormous computation. The computation to obtain the optimum solution of exposure sequence is conducted upon exchange of reticles of different exposure patterns, upon exchange of wafers, for example, from the reason that unexposed portions are designated randomly for each of the individual wafers though an identical exposure pattern is applied, and so on. Therefore, the allowed computation time varies depending upon the cases. For example, the time necessary for replacement of reticle and alignment of the reticle (reticle loading time) is approximately 20 seconds, and the time for replacement of wafer and alignment of the wafer (wafer loading time) is approximately 10 seconds. Further, if the load on a computer is high during alignment, the computation to obtain the optimum solution of exposure sequence must be conducted within wafer replacement time (for example, one second or so).

An object of the present invention is, therefore, to provide a movement sequence determining method for achieving a preferred solution of movement sequence within short time and an apparatus for realizing it. The movement sequence determining method according to the present invention is a method of, upon executing a predetermined process of exposure, inspection, or the like on a wafer or the like, first obtaining within a very short time a near-optimum solution of a movement sequence (for example, including an exposure sequence or an inspection sequence) to shorten turnaround time necessary for the entire process, then successively generating solutions to further shorten the overall turnaround time of movement sequence as far as computation time allows, and finally generating an optimum solution (if a sufficient, allowed computation time is given). This can provide a solution with quality consistent with the allowed computation time given (a better solution with a longer allowed computation time), depending upon the circumstances of available computation resources.

The movement sequence determining method according to the present invention is a movement sequence determining method that can determine within short time both an order of exposure processes or inspection processes of all chip areas and scan directions of successively exposed or inspected areas in the respective chip areas (hereinafter referred to as scan directions of local areas), mainly, for a plurality of process areas (chip areas) on a surface of a wafer exposed or inspected with scan in a specific direction (one direction selected from finite directions) along the surface of the wafer being a photosensitive substrate. The movement sequence determining method according to the present invention can be applied not only to the scanning exposure type steppers involving movement between chip areas (movement of the wafer stage) and scanning of local area in each chip area (movement of the reticle stage or the sensor stage), but also to the one-shot exposure type steppers.

In particular, in order to solve the above problems, the movement sequence determining method according to the present invention comprises an arithmetic step of obtaining a solution of movement sequence most preferred with respect to a total movement time between plural chip areas (or an overall turnaround time necessary for the process of exposure, inspection, or the like including movement between the chip areas), using at least one of a method based on operations research technique and an evolutionary computation method (including genetic algorithm). This arithmetic step comprises at least a first step of generating a group including a plurality of movement sequences capable of being carried out, out of a group of movement sequence candidates, each indicating scan directions of local areas in the plural chip areas and a process order (visit order) of the plural chip areas, and a second step of selecting a movement sequence in which the movement operation between the plural chip areas (the overall turnaround time necessary for the predetermined process also including the movement between chip areas) is completed within the shortest time, out of the group generated. The above arithmetic step can also be carried out plural times, thereby a most preferred solution of movement sequence at that time can be obtained every completion of arithmetic step. In the second step of the above arithmetic step, the size of a pattern region formed on the mask and the size of the substrate are also taken into account as information concerning the mask (reticle) and the wafer (photosensitive substrate).

Specifically, the movement sequence determining method according to the present invention comprises a prestep of producing a movement time management table in which times necessary for movement between chip areas are recorded, prior to the arithmetic step, in order to decrease the turnaround time of the above arithmetic step.

The optimum solution of movement sequence must be determined also taking account of the scan directions of local areas each processed in each chip area on the wafer. In practical operations there could occur cases wherein scanning is permitted only in one direction or in plural directions, depending upon the chip areas. Therefore, the above movement time management table stores the movement times, each being necessary for movement from a scan end position in a chip area after completion of the process of exposure or the like to a scan start position in each of chip areas to which the exposure light is allowed to move. This movement time management table also includes information about inhibition of movement from a scan end position in one chip area to a scan start position in another chip area, for all combinations of chip areas between which the exposure light is not allowed to move. As also seen from this, the above movement time management table also includes the information concerning the scan directions of local areas in the respective chip areas, in addition to the information concerning the movement order of each chip area.

The movement sequence determining method according to the present invention uses a genetic algorithm (which is one of evolutionary computation methods) as a search technique for a good solution or an optimum solution of movement sequence to be found, in the above arithmetic step, or takes into the genetic algorithm (GA) an improving search technique as a genetic operator, such as a method based on operations research technique (including at least one of a linear programming method (NN method), an algorithm by Lin and Kernighan (S. Lin and B. W. Kernighan, An Effective Heuristic Algorithm for the Traveling Salesman Problem, Operations Research 21 (1973) pp 498–516), or a k-OPT method (including the 2-OPT method and the 3-OPT method) ("Practical course: Invitation to traveling salesman problems I, II, III," Operations Research 39 (1994), No. 1: pp 25–31, No. 2: pp91–96, No. 3: pp 156–162), thereby a best movement sequence out of the solutions obtained at that time is always presented even on the way of computation for obtaining the optimum solution of movement sequence. Further, this search technique can attain a better movement sequence with more time for computation, and is thus characterized in that it can obtain a movement sequence with good quality consistent with the allowed computation time even when computation is interrupted or even when the computation time is preliminarily limited.

For maintaining diversity in the movement sequence candidate group produced in the above arithmetic step, the genetic algorithm has a mutation operator. This mutation operator has at least one of an operator (Cyclic Shift) for exchange of movement order (visit order) of plural chip areas selected out of the plural chip areas, and an operator (Direction Flip) for inversion of scan direction in one chip area or two or more chip areas selected out of the plural chip areas.

Further, the movement sequence determining method according to the present invention can also utilize, as a search technique for a best or optimum solution of movement sequence carried out in the above arithmetic step, one of the operations-research-like techniques such as the linear programming method, the Lin and Kernighan's algorithm, or the k-OPT method, and combinations thereof.

As for generation of an initial solution, for example, in the case of the above linear programming method, a possible arrangement is such that when there exists a plurality of near-optimum solutions as to a movement sequence to be found, a plurality of good solutions are generated by recalculation by a different method for selecting a specific one or by recalculation with a different search start point and a good solution most preferred with respect to the total movement time between the plural chip areas out of these plural good solutions generated is set as an initial solution of the genetic algorithm. In the case of the combinations of the above approaches including the linear programming method, a possible arrangement is such that a plurality of first good solutions obtained by the linear programming method for the movement sequence to be found are used as initial solutions, a plurality of second good solutions are generated therefrom by the Lin and Kernighan's algorithm or the k-OPT method, and a second good solution most preferred with respect to the total movement time between the plural process areas out of the plurality of second good solutions thus generated is set as an initial solution of the genetic algorithm.

The movement sequence determining method according to the present invention can be carried out in the exposure apparatus or the inspection apparatus described previously and, in this case, the apparatus has an arithmetic section for carrying out the above arithmetic step and comprises at least a memory for storing the above table.

As described above, the movement sequence determining method according to the present invention continuously generates good solutions of movement sequence successively improved and updated in the algorithm, using the evolutionary computation method (including the genetic algorithm). Further, for the plural process areas (n chip areas), the genetic algorithm is utilized as a search technique for the optimum solution in order to obtain the optimum solution of movement sequence (a candidate to minimize the overall turnaround time in the candidate group) for processing the all process areas, out of the movement sequence candidate group of combinations ($M^n$) of the process area visit orders (n! ways) for processing the all process areas and the scan directions (m degrees of freedom) of local areas in the respective process areas. Each of genes in the genetic algorithm is made to simultaneously store scan directions of the reticle (or the sensor) (note: scanning of the reticle or the like corresponds to scanning of the exposed or inspected local area in each process area on the wafer) and an exposure (inspection) order of the object (the photosensitive substrate such as the wafer), thereby the optimum solution of movement sequence can be generated also taking account of change in the position of the object (start/end point of exposure or inspection) depending upon the scanning of the reticle (or the sensor) and thereby the optimum and near-optimum solutions can be generated taking account of synchronization of the two moving stages on the object (chip area) side and on the reticle side (sensor side). The genetic algorithm is used, for example, as an approach for the case to find the shortest path in visiting all cities only once, but there has been and is no example of application to the apparatus such as steppers in order to optimize exposure (inspection) paths of chip areas on the wafer.

In addition, the present invention adopts the principle of the genetic algorithm, which is a principle to successively generate near-optimum solutions by two features; (1) simultaneous progress of a local search and a global search in the space of interest by a combination of a crossover operator with a mutation operator; and (2) alteration of generation for repetitively carrying out a series of operations for objects of finite genes including the best gene of each generation, one generation being defined as a series of operations by the genetic operators; and to finally obtain the optimum solution. Therefore, the near-optimum solution or the optimum solution can be efficiently generated with depending upon the turnaround computation time.

Considering applications to a positioning device of the reticle (or sensor) scanning type, the scan directions of local areas and the exposure (inspection) order of objects are simultaneously stored in each of the genes in the genetic algorithm, whereby the optimum solution can be generated also taking account of change in the position of object (start/end point of exposure or inspection) depending upon the scanning of the reticle (or the sensor) and whereby the optimum and near-optimum solutions can be generated efficiently taking account of synchronization of the two moving stages on the object side and on the reticle (sensor) side.

Since the information stored in each gene is the length depending upon the number of chip areas as objects in the process of exposure, inspection, or the like, when an unnecessary region of exposure (or inspection) is designated optionally, a necessary operation is only changing the information stored in the gene and the algorithms such as the genetic operators and the alteration of generation can be used as they are. In the case wherein there is a constraint of scan direction in each chip area, the optimum solution can be searched out of constraint satisfying solutions by eliminating genes having information not satisfying the constraint upon alteration of generation.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 4 is a table to show various conditions including the number of chips etc., in the scanning exposure type projection exposure apparatus shown in FIG. 1;

FIG. 5 is a table to show coordinates of each chip area on the wafer and scan directions of local areas as objects of the predetermined process of exposure, inspection, or the like in the respective chip areas;

FIG. 7 is a drawing to show a movement time management table produced prior to the arithmetic step in the movement sequence determining method according to the present invention;

FIG. 26 is a table, as an additional example, to show coordinates (X, Y) of each of chip area on the wafer and scam directions of local areas as objects of the predetermined process of exposure, inspection, or the like in the respective chip area;

DETAILED DESCRIPTION OF THE PREFERRED EMBODIMETNS

The movement sequence determining method and the apparatus for realizing it according to the present invention will be described using FIG. 1 to FIG. 25. The following embodiments are examples for explaining how to obtain the optimum exposure sequence (an exposure order of the shot areas on the wafer), mainly, in the scanning exposure type projection exposure apparatus.

Figure 1:
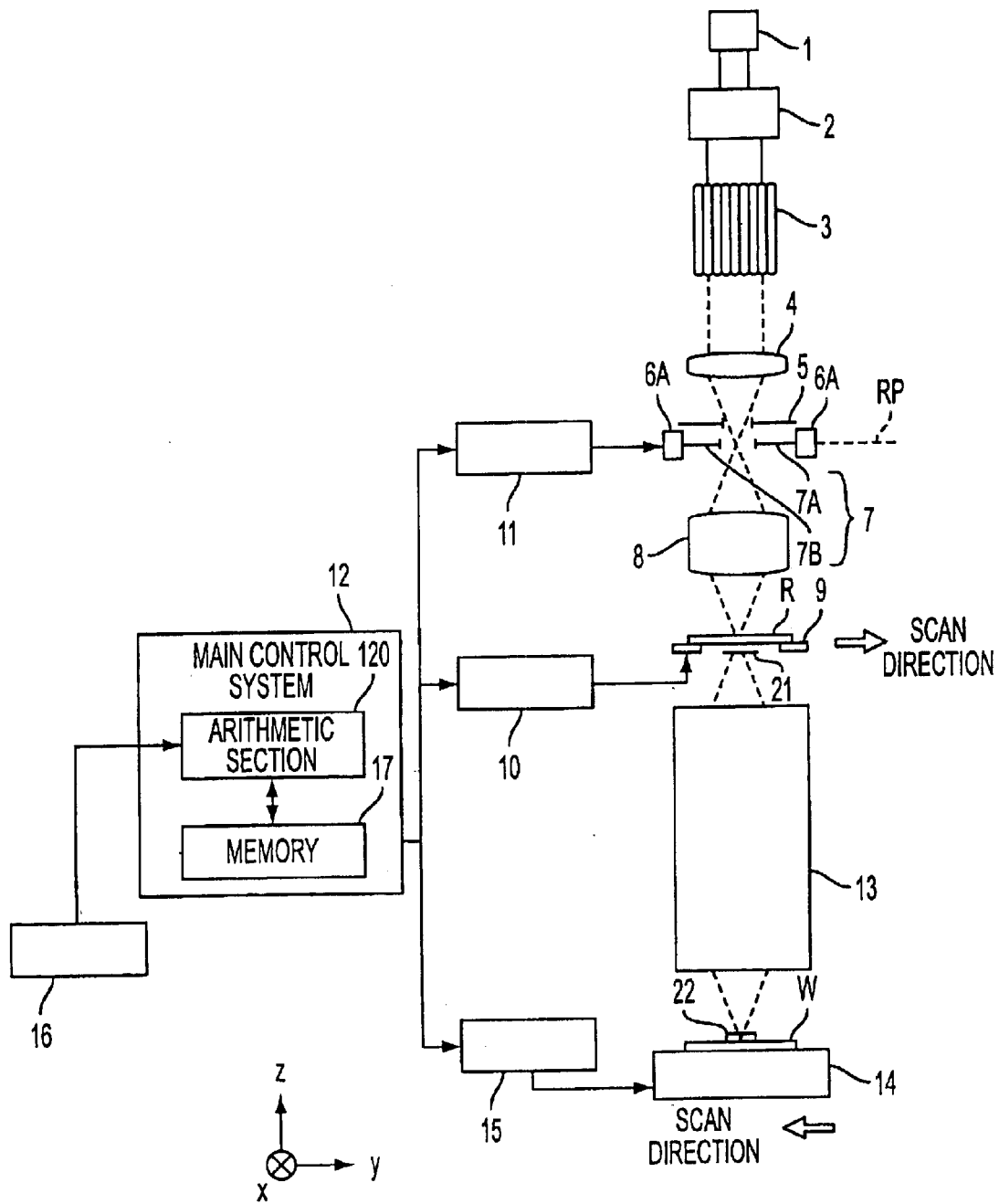
FIG. 1 is a drawing to show the schematic structure of the whole of a scanning exposure type projection exposure apparatus as an apparatus for realizing the movement sequence determining method according to the present invention.

FIG. 1 is a drawing to show the schematic structure of the whole of the scanning exposure type projection exposure apparatus as an apparatus for realizing the movement sequence determining method according to the present invention. In FIG. 1, illumination light from light source 1 is guided through an illumination optical system, which is composed of illumination light shaping optical system 2, fly's eye lens 3, condenser lens 4, and relay lens 8, to the reticle R to uniformly illuminate a rectangular slit illumination area 21 in predetermined illuminance on the reticle R. Then an image of a circuit pattern of reticle R in the slit illumination area 21 is transferred through projection optical system 13 onto the wafer W.

The light source 1 can be selected from excimer laser light sources such as the ArF excimer laser or the KrF excimer laser, lamp light sources having the structure of a combination of a mercury lamp with an ellipsoidal reflector, and so on.

The illumination light from the light source 1 is shaped by the illumination light shaping optical system 2 into a predetermined beam size and then reaches the fly's eye lens 3. Many secondary light sources are formed on the exit plane of the fly's eye lens 3 and illumination light from these secondary light sources is condensed by the condenser lens 4 to travel through a fixed field stop 5 to a movable blind (variable field stop) 7. Although the field stop 5 is located between the movable blind 7 and the condenser lens 4 in the projection exposure apparatus of FIG. 1, the field stop 5 may be located between the movable blind 7 and the relay lens system 8.

A rectangular slit aperture portion is formed in the field stop 5 and the light, having passed through the aperture portion of this field stop 5, is shaped into a rectangular slit shape to enter the relay lens system 8. The relay lens system 8 is a lens system for making the movable blind 7 and the pattern-formed surface of the reticle R conjugate with each other. The movable blind 7 is composed of two wings (shield plates) 7A, 7B for defining the width in the scan direction (Y-direction) of the reticle stage 9 and two wings (not illustrated) for defining the width in the direction perpendicular to the scan direction. The wings 7A and 7B for defining the width in the scan direction are supported by driving portions 6A and 6B so as to move along the scan direction independently of each other. In this embodiment, the illumination light is radiated only in a desired exposure area defined by the movable blind 7, in the illumination area 21 (of the slit shape) defined on the reticle R by the fixed field stop 5. The relay lens system 8 is a bitelecentric optical system, which maintains telecentricity in the illumination area 21 on the reticle R.

The reticle R is mounted on the reticle stage 9 and the image of the circuit pattern defined by the movable blind 7 and within the illumination area 21 on the reticle R is projected through the projection optical system 13 onto the wafer W. -A region on the wafer W conjugate with the illumination area 21 is a slit exposure area 22. In the two-dimensional plane perpendicular to the optic axis of the projection optical system 13, the scan direction of the reticle R relative to the illumination area 21 is defined as the positive Y direction (or the negative Y-direction) and the direction of the optic axis of the projection optical system 13 as the Z-direction.

In this case, the reticle stage 9 is driven by reticle stage driver 10 to move the reticle R and to scan the reticle R in the predetermined scan direction (i.e., in the positive Y-direction or in the negative Y-direction). The operation of the driving portions 6A, 6B of the movable blind 7 is controlled by movable blind controller 11. The operations of the reticle stage driver 10 and the movable blind controller 11 are controlled by a main control system 12 for controlling the operation of the entire apparatus. This main control system 12 has at least an arithmetic section 120 for carrying out the arithmetic step for computing the optimum solution of movement sequence according to the present invention and a memory 17 for storing the movement time management table produced prior to the arithmetic step.

Figure 2:
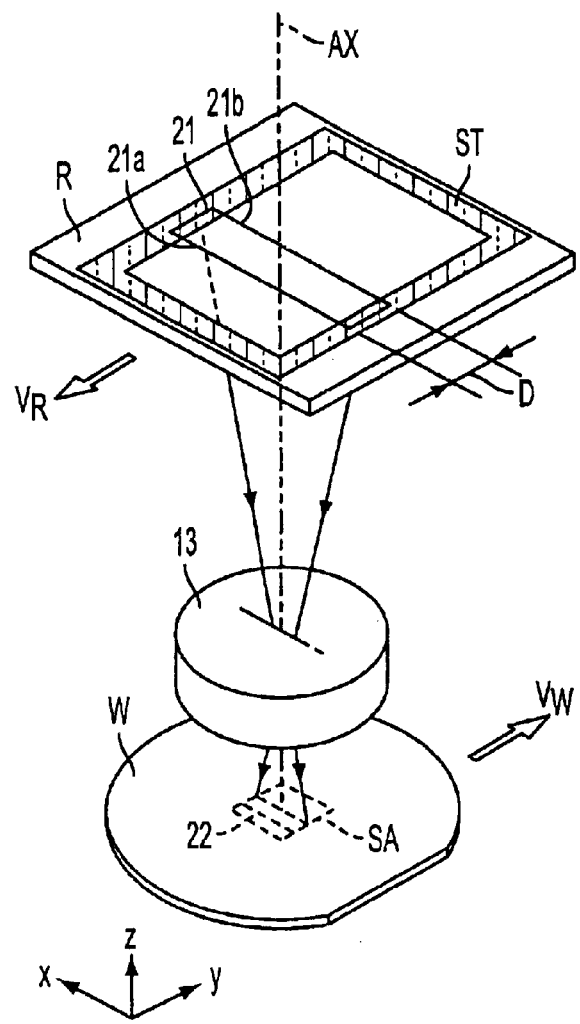
FIG. 2 is a perspective view for explaining the exposure operation in the scanning exposure type projection exposure apparatus shown in FIG. 1.

On the other hand, the wafer W is mounted on wafer stage 14, and the wafer stage 14 is composed mainly of an XY stage for positioning the wafer W and for moving the wafer W in the ±Y-directions on the plane perpendicular to the optic axis of the projection optical system 13, and a Z-stage for positioning the wafer W in the Z-direction. The main control system 12 also controls the positioning operation and scanning operation of the wafer stage 14 through wafer As shown in FIG. 2, when the image of the pattern on the reticle R is projected into each chip area on the wafer W through the projection optical system 13 by the scanning exposure method, the reticle stage 9 moves so as to scan the reticle R at velocity $V_R$ in the negative Y-direction (or in the positive Y-direction) relative to the slit illumination area 21 defined by the field stop 5 of FIG. 1. When the projection magnification of the projection optical system 13 is $\beta$, the wafer stage 14 moves so as to scan the wafer W at velocity $V_w (=\beta \cdot V_R)$ in the positive Y-direction (or in the negative Y-direction) relative to the slit exposure area 22 in synchronism with the scanning of the reticle R. This sequentially transfers the image of the circuit pattern of the reticle R into the chip area SA (which will also be called the shot area) on the wafer W.

In this embodiment the wings 7A and 7B of the movable blind 7 of FIG. 1 are driven independently of each other by the driving portions 6A and 6B so that one edge 21a and the other edge 21b for defining the illumination area 21 move each along the scan direction. However, since the fixed field stop 5 is provided in FIG. 1, the width of the illumination area 21 in the scan direction is D even in the fully opened state of the movable blind 7; the movable blind 7 is thus used for making the width of the illumination area 21 narrower than D. Further, the width of the illumination area 21 is set to D during the normal exposure, and the movable blind 7 is used at the start and end of exposure.

In this embodiment the circuit pattern is drawn in the pattern area surrounded by shield zone ST of the reticle R as shown in FIG. 2. The numbers and sizes of pattern areas of the reticle R and chip areas, the size of the wafer W, etc. are supplied through an input section 16 such as a keyboard as shown in FIG. 1 to the memory 17 of the main control system 12, and the main control system 12 reads the pattern information concerning the reticle R out of the memory 17, prior to determining the exposure sequence of the chip areas. Upon execution of reticle loading the numbers of pattern areas of a new reticle R and chip areas etc. are already stored in the memory 17, and thus the main control system 12 determines the optimum exposure sequence suitable for the reticle before the end of the reticle loading.

On the other hand, alignment of each chip area on the wafer W can be achieved by detecting positions of predetermined marks out of alignment marks given to each chip area on the wafer W by use of a wafer alignment system not illustrated, and performing an arithmetic based on the detection result (for example, see Japanese Laid-open Patent Application No. 61-44429).

Next described is an example of the operation upon carrying out the exposure in the scanning exposure method in the apparatus shown in FIG. 1.

First, the operation on the reticle R side will be described referring to FIG. 3. For carrying out the exposure in the chip areas on the wafer W, the reticle stage 9 moves the reticle R back and forth on an empirical basis. This is for eliminating a wasteful motion on the reticle R side. However, when the scanning exposure process is started from the start position at the edge of the wafer W, the autofocus (the operation for matching the image plane of the projection optical system 13 with the surface of chip area) could be disabled before arrival at the chip area. Therefore, there are also some cases to employ a path not reciprocating the reticle R. This case will be described hereinafter with FIG. 6.

Figure 3:
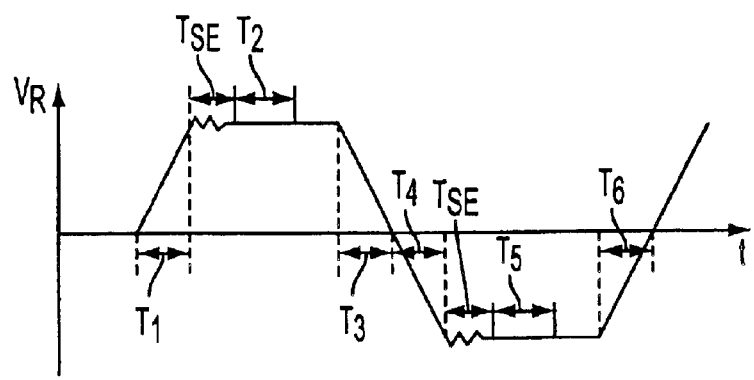
FIG. 3 is a drawing to show a state of change in scanning velocity $V_R$ of the reticle (mask) upon the exposure operation in the scanning exposure type projection exposure apparatus shown in FIG. 1.

FIG. 3 is a drawing to show change in the scanning velocity $V_R$ of the reticle R under the reciprocating motion. In this FIG. 3, acceleration of the reticle R is first started in period $T_1$, and exposure is done during period $T_2$ in which the scanning velocity $V_R$ of the reticle R is stable, after a predetermined setting period $T_{SE}$. After that, the reticle R is decelerated in period $T_3$, and during period $T_4$ immediately after stop of the reticle R, acceleration of the reticle R is started in the opposite direction.

After the subsequent setting period $T_{SE}$, exposure is done during period $T_5$ in which the scanning velocity $V_R$ of the reticle R is stable. Then the reticle R is decelerated during period $T_6$, and this operation is repeated thereafter.

In the second half of the acceleration periods $T_1$ and $T_4$ of the reticle R the wafer W is also accelerated. From the second half of the deceleration periods $T_3$ and $T_6$ of the reticle R to the first half of the acceleration periods $T_4$ and $T_1$ respectively, the next chip area of the wafer W is set at the acceleration start position (scan start position) of scanning exposure by stepping movement of the wafer stage 14. Of course, in the case of the reticle R not being moved back and forth, the wafer W moves in the opposite direction in synchronism with movement of the reticle R.

Next, the optimization of exposure sequence of chip areas, computed by the arithmetic section 120 of the main control system 12, will be described, but, prior thereto, preconditions necessary for the arithmetic will be described first.

Figure 6:
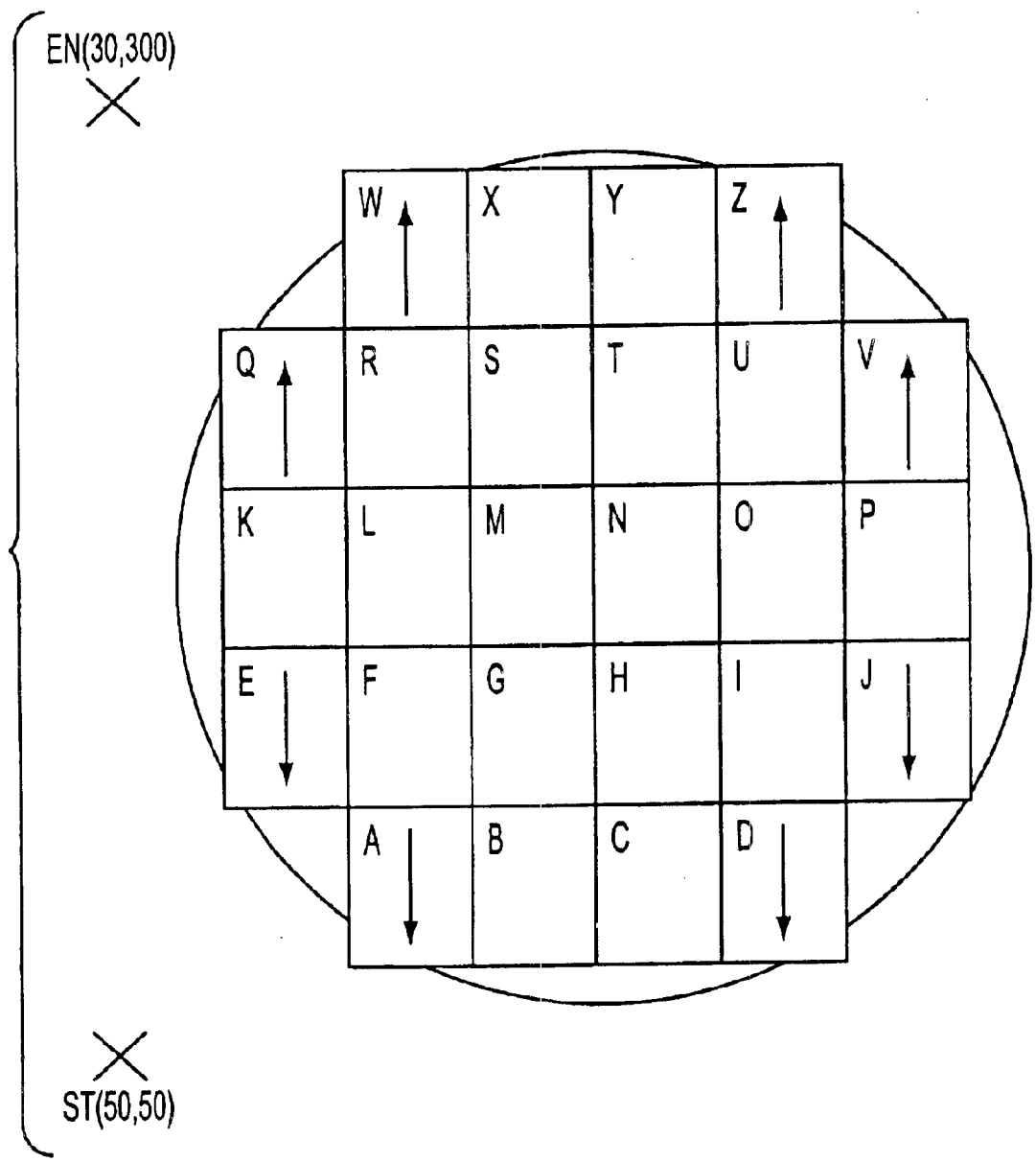
FIG. 6 is a drawing to show a surface of the wafer provided with the chip areas A–Z defined in the table of FIG. 5, illustrating constraints of scan direction in each chip area.

FIG. 4 to FIG. 6 are drawings to show the preconditions necessary for obtaining the exposure sequence of chip (shot) areas, for comparing the effect of the embodiment according to the present invention with the conventional technology. Of course, this is just an example, and the conditions such as the size and the number of chip areas can be changed freely.

FIG. 4 indicates the initial and final points of the wafer stage 14 and other factors. The moving time from the fore to the back or from the back to the fore of the reticle stage 9 is computed as shown in FIG. 3. For example, in the case of FIG. 4, the moving time from the fore to the back or from the back to the fore of the reticle stage 9 is approximately 0.5 sec.

Accelerations and maximum velocities of movement of the stages are as given in FIG. 4, because the time of movement in the X-direction is different from that in the Y-direction because of a difference in weight between the Y-stage and the X-stage, their mechanisms, and the like.

As described above, a predetermined distance is necessary before the wafer stage 14 reaches a predetermined speed. A distance including this distance (movement amount) is referred to as a forward offset. For example, a forward offset for a backing chip means a distance including a distance of approach run necessary for movement of the wafer stage 14 in the negative Y-direction and a distance from the center of the chip area to the edge of the chip area. A backward offset for an advancing chip means a distance including the distance from the center of the chip area to the edge of the chip area and a stop distance necessary for movement of the wafer stage 14 in the negative Y-direction.

For example, as to the scanning exposure of each of the chip areas, let us consider a system for temporarily stopping the wafer stage 14 immediately after completion of the movement of the wafer stage 14 and the movement of the reticle stage 9 in the Y-direction during exposure. In this case, the forward offset for advancing chips and for backing chips is given by a distance which the wafer stage 14 moves during the acceleration period and setting period of the reticle stage 9 and during the period necessary for exposure from the start of scan to the center point of chip area. The backward offset for advancing chips and for backing chips is given by a distance which the wafer stage 14 moves during the period from the time of exposure at the center point of chip area to the end of exposure and during the period in which the reticle stage 9 is decelerated and then stops. Computing the offsets in the case of FIG. 4, the forward offset for advancing chips and for backing chips is approximately 38 mm and the backward offset for advancing chips and for backing chips is approximately 35 mm. In this case, a unit movement sequence turnaround time can be set well to a turnaround time from the time of completion of movement toward the position given by the offset after the end of one scan exposure, to completion of movement to the position given by the offset immediately before the start of next scan exposure in a next chip area.

FIG. 5 is a table to show coordinates (X, Y: in units of mm) of the center of each of 26 chip areas denoted by letters A to Z in the coordinate system on the wafer and constraints on the scan direction of local area in each chip area. The size of each chip area is 25 mm (in the X-direction)×33 mm (in the Y-direction). Center-to-center distances between the chip areas A to Z are 25 mm in the X-direction and 33 mm in the Y-direction. The scan directions are indicated by three types of notations, forward by "fore", backward by "back", and no constraint by "any". The constraints on the scan direction in each chip area will be explained referring to FIG. 6.

FIG. 6 is a drawing to show a view of the surface of the 8-inch wafer in which the chip areas A to Z are located at the positions specified in FIG. 5. The arrows drawn in the chip areas A to Z indicate presence of constraints on the scan direction as indicated by the directions of the arrows. Absence of arrow means no constraint on the scan direction (any). In the chip areas A, D, E, and J the scan direction is backward (back). This is from the following reason. If the scanning exposure were started from the start position at the fore, a point of detection by an autofocus sensor (not illustrated) would be on the edge of the wafer W. In this case, focus is made at a position shifted by the thickness of the wafer W. In order to avoid this, the scan direction is restricted. This is also the reason why the scan direction is forward (fore) for the chip areas Q, V, W, and Z. The constraints on the moving direction of the reticle R are opposite to those of the chip areas. At the start of scanning exposure the wafer stage 14 moves so that the optic axis of the projection optical system 13 is at the start point ST (X=50, Y=50); at the end of scanning exposure the wafer stage 14 moves so that the optic axis of the projection optical system 13 is at the end point EN (X=30, Y=300).

Next described is the operation for producing the movement time management table for unit movement sequences (each being a moving path from a chip area of a current exposure object to a chip area of a next exposure object), carried out prior to the arithmetic step utilizing the genetic algorithm (GA).

During the scanning exposure the wafer stage 14 and reticle stage 9 operate in synchronism with each other. Accordingly, the overall turnaround time of the exposure sequence during the scanning exposure is not an object of the optimization of movement sequence in the present invention, but the object of the optimization is to eliminate waste time from the all movement sequence except for the sequence of scanning exposure as much as possible.

Then, let us first consider a movement turnaround time for an arbitrary unit movement sequence. Specifically, let us consider a time from a point of completion of exposure of an arbitrary chip area in an arbitrary scan direction (i.e., a point of start of a unit movement sequence) to a point of start of exposure of another arbitrary chip area in an arbitrary scan direction (i.e. a point of end of the unit movement sequence). The number of cases of arbitrary unit movement sequences is 2n×2×(n−1) even in the case wherein there are n chip areas and no constraints on the scan directions of the all chip areas (or at most 2n×2×(n+1) even in the case wherein the positions of the wafer stage 14 and the reticle stage 9 before and after the series of exposure sequences are designated). From the above preconditions, shortest movement times for the respective unit movement sequences can be attained readily and uniquely, and thus these are computed first. Then computation results of these are first recorded in a two-dimensional table (movement time management table) having separate axes for the start point of unit movement sequence (scan end position) and for the end point of unit movement sequence.

FIG. 7 shows the above movement time management table. In this movement time management table, for example, A (+) indicates a position where scanning in the +(forward) direction is ended in the chip area A on the wafer; A(−) a position where scanning in the −(backward) direction is ended in the chip area A on the wafer. Accordingly, for example, the numeral (in unit of sec) indicated by F1 in the table of FIG. 7 tells us that 0.159665 sec is necessary for movement of the wafer stage 14 from the position of the end of scanning in the (+) direction in the chip area B to the position of the end of scanning in the (−) direction in the chip area A.

Each symbol "X" shown in the table of FIG. 7 designates a combination of impossible movement between elements (the scan start position and scan end position). For example, it is impossible to move from the position of the end of scanning in the (+) direction in the chip area B to the position of the start of scan in the (+) direction in the chip area A. Since only scanning in the (−) direction is permitted in the chip area A, the all combinations of movement to the element A (+) are denoted by "X."

Further, START in the table of FIG. 7 denotes the start point of movement sequence while END the end point of movement sequence. START (+) indicates that at the start point of movement sequence the reticle R is present on the plus side (i.e., at the movement start position of the reticle R in the case of scanning in the (−) direction), and START (−) indicates that at the starting point of movement sequence the reticle R is present on the minus side (i.e., at the movement start position of the reticle R in the case of scanning in the (+) direction). On the other hand, END (+) indicates that the end point of movement sequence is present at the end position (on the minus side) when the reticle R is scanned in the (+) direction, and END (−) indicates that the end point of movement sequence is present at the end position (on the plus side) when the reticle R is scanned in the (−) direction.

The table produced is stored in the memory 17 in the main control system 12 of FIG. 1.

After completion of the steps heretofore, the optimum exposure sequence is determined by optimization (in the sense to minimize the final exposure sequence); which unit movement sequences should be used in what order out of the unit movement sequences (representing components of the movement sequence to be found and corresponding to sequences, each from a chip area to be processed at a certain point to another chip area to be processed next). The reason why the unit movement sequences to be used have to be selected is to avoid scanning exposures of one chip area in opposite directions. Accordingly, the overall turnaround time of movement sequence can be obtained from the above table only by determining the exposure order of the chip areas and the scan direction in each chip area. Conversely, to determine the exposure order of the chip areas and the scan direction of each chip area so as to minimize the overall turnaround time of movement sequence is the same as the optimization of movement sequence, which is the object of the invention.

The movement sequence determining method according to the present invention will be described in further detail with specific embodiments using the genetic algorithm.

The arithmetic step in the movement sequence determining method automatically obtains the optimum solution of exposure sequence of the chip areas (an exposure sequence of the shortest time), using the genetic algorithm (hereinafter referred to as GA) which is a typical example of the evolutionary computation method.

Figure 8:
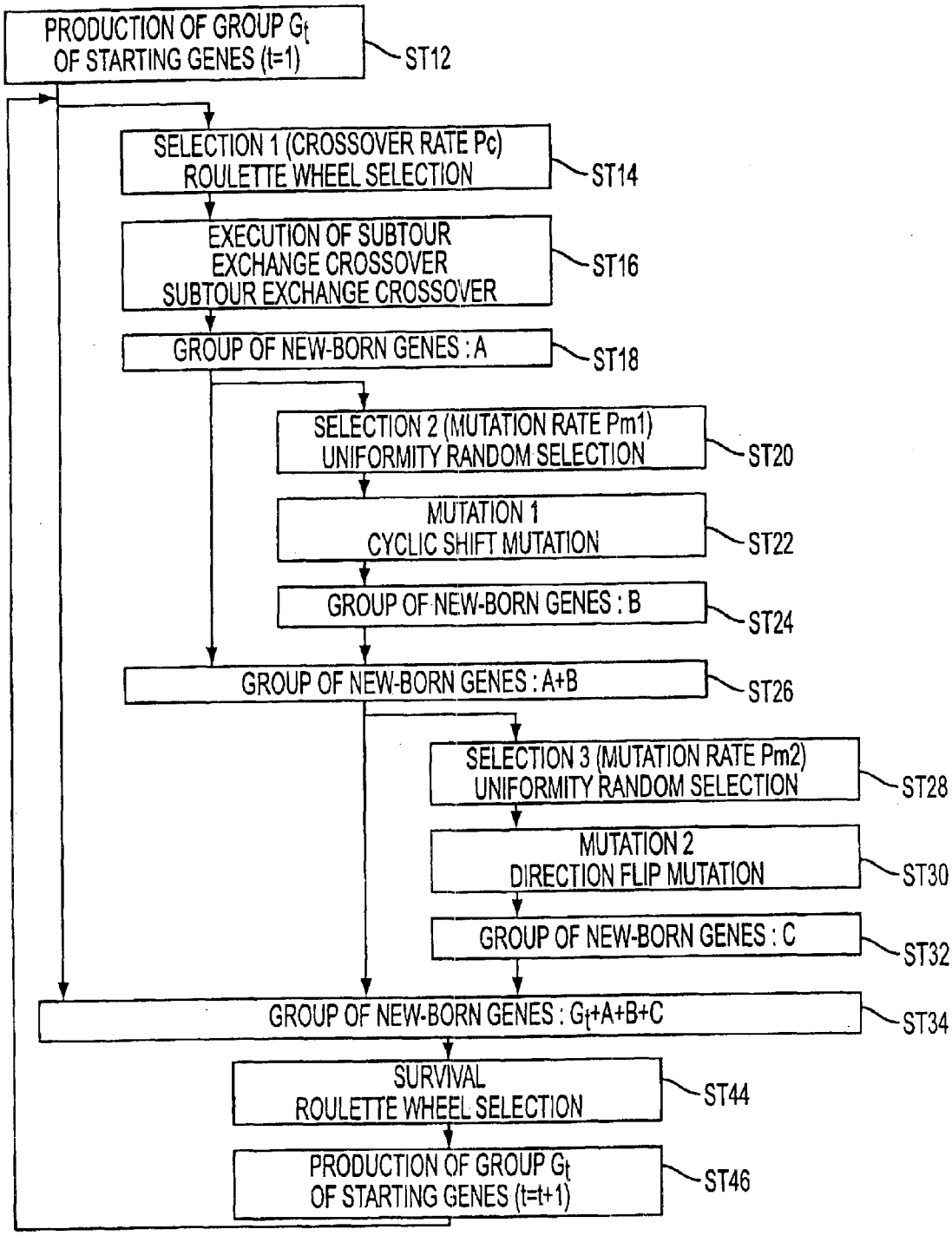
FIG. 8 is a flowchart for explaining one operation of the arithmetic step using the evolutionary computation method (genetic algorithm) in the movement sequence determining method according to the present invention.
Figure 9:
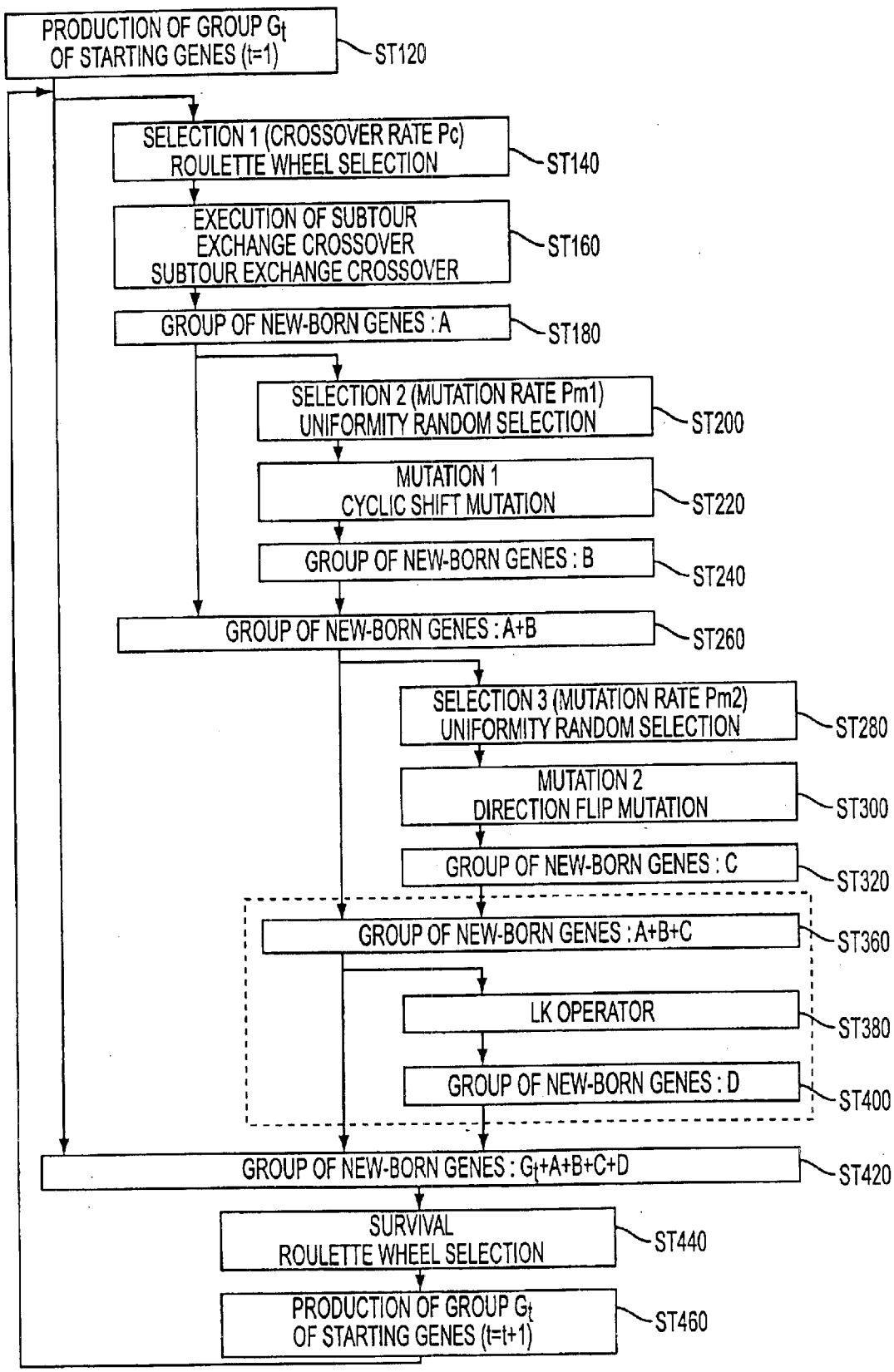
FIG. 9 is a flowchart for explaining another operation of the arithmetic step using the evolutionary computation method (genetic algorithm) in the movement sequence determining method according to the present invention.

FIG. 8 and FIG. 9 illustrate flowcharts for explaining the operation of the genetic algorithm. The name of the genetic algorithm was given because individual operations thereof can be compared to genes, as will be described below.

An initial solution of the genetic algorithm is arbitrary. Accordingly, the genetic algorithm can be readily combined with another search method and it is also easy to incorporate only an advantage of another search method into a genetic operator. Therefore, proper analysis of problem and programmer's experiences in evolutionary computation are required to achieve an efficient approach with high degrees of freedom of design.

The genetic algorithms can be classified roughly into GA (Genetic Algorithm) as a combinatorial optimization approach placing the main point on crossover, ES (Evolutional Strategy) as a continuous value optimization approach placing the main point on mutation, and, different in classification from these, GP (Genetic Programming) directed to the source and process procedures of program, but the essence of the all algorithms is identical.

In the GA, a group search is carried out with agents called plural (N) "genes," and the GA thus has such a property that even if a part of the group falls into a local optimum solution but if the other gene finds a better solution the search is led to the better solution. Since it is a multipoint search, it takes some time, but can efficiently search the optimum solution. A plurality of pairs (parents) are selected from the gene group consisting of the N genes and each of the gene pairs P bears children C resembling their parents. Further, some children C experience mutation in part of gene. Among these genes, descendents having genes with higher evaluation are made to survive with higher probability in the next generation. Since the size of the group is normally fixed to N throughout generations except for special cases, descendents having genes with lower evaluation will gradually become extinct. Repetition of such alteration of generation will find plural (N) genes with the optimum solution appearing in the group sooner or later.

This embodiment adopts the Subtour Exchange Crossover (SXX) famous as an approach by GA in order to improve the exposure sequence of chip areas. On the other hand, as to the scan direction in each chip area, it is contemplated that the scan direction in a chip area without any constraint on the scan direction is inverted by mutation. In this way the optimization problem of exposure sequence in the scan exposure type stepper is formulated by the GA. Examples of models for the alteration of generation used in the GA include the MGG (Minimum Generation Gap) model in which the all genes are paired without any unmarried person and best two genes out of each family including a pair and children born are left to the next generation (H. Satoh, M. Yamamura and S. Kobayashi, Minimum Generation Gap Model for GAs Considering Both Exploration and Exploitation, Proceedings of IIZUKA '96, pp. 494–497), and the Elitist model in which good people out of the all parents and children are left preferentially (D. E. Goldberg, Genetic Algorithm in Search, Optimization and Machine Learning, Addison-Wesley Publishing Company Inc., 1989). The MGG model is used if the true optimum solution is desired to obtain finally even with some computation time; whereas the Elitist model is used if a good solution can be found in the early stage of the computation process and even if a computation time longer than that in the MGG model is necessary for obtaining the true optimum solution. Thus, they can be used selectively based on how to make the trade-off between the computation time and the quality of solution. In this embodiment, an embodiment using the Elitist model will be described as an example of such selective use.

Before describing the algorithms of FIG. 8 and FIG. 9 in detail, each of operators shown in the algorithms will be described first.

In FIG. 10 to FIG. 13 P1, P2, C1, C2, etc. represent exposure orders of chip areas and scan directions upon exposures of the respective chip areas, imitating the genes, and the genes are stored in the memory 17. A cell surrounded by a square indicates one unit for a position of one exposure and a scan direction. One gene is expressed by a string of n units corresponding to n exposure positions. Since this embodiment involves the chip areas A to Z, one gene is considered to be composed of 26 units. For simplification of description, instead of the 26 chip areas of A to Z, each operator in FIG. 10 to FIG. 13 will be described using exposures of eight chip areas of the chip areas A to F, i.e., regarding the eight chip areas as one gene.

Figure 10:
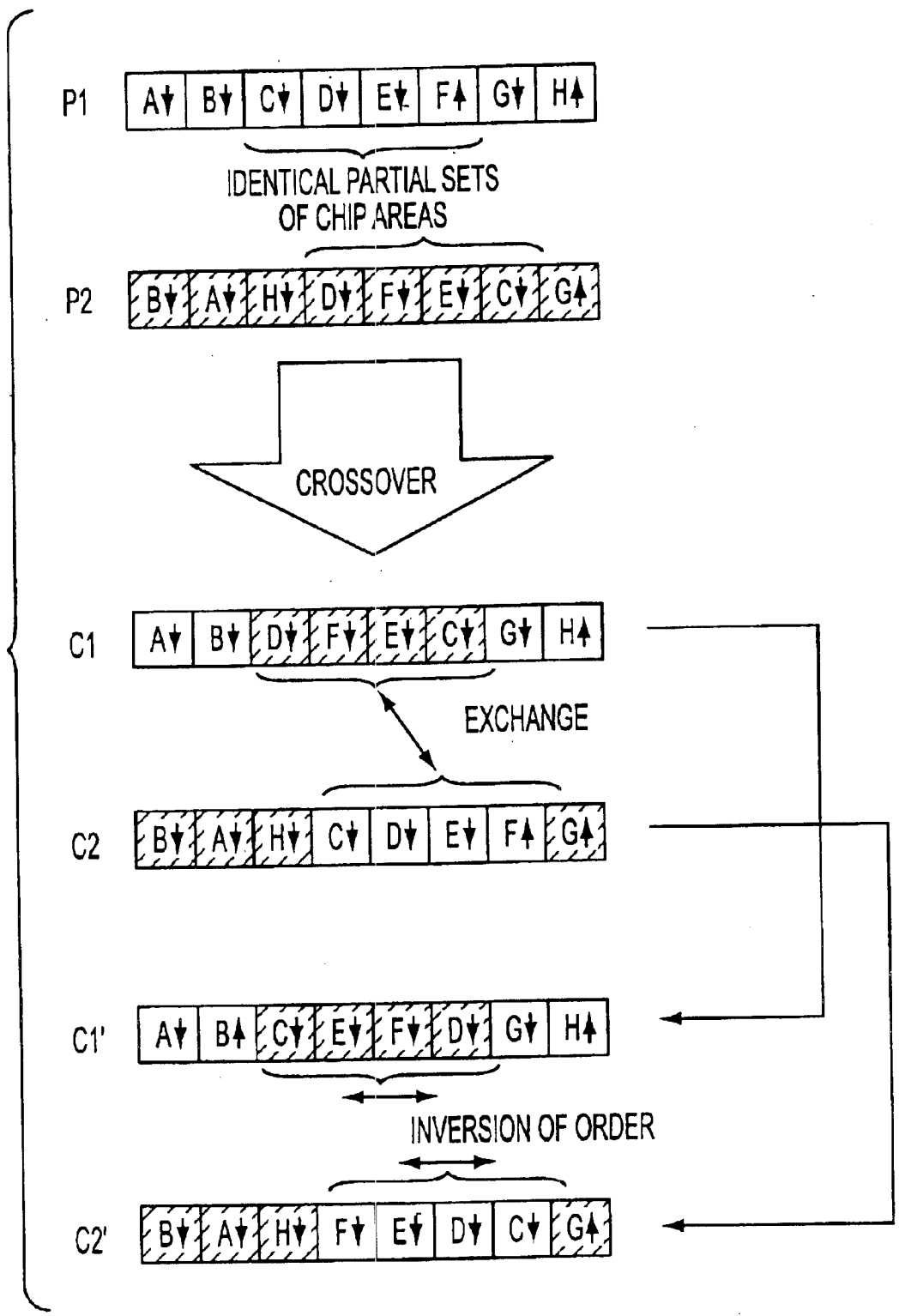
FIG. 10 is a drawing for explaining a crossover operator in the genetic algorithm (GA)

FIG. 10 illustrates a crossover operator for subtour exchange crossover which is one of the genetic operators. The concept of the crossover operator is to make from two parents two or more children having characteristics of the both parents. The crossover operator applies the subtour exchange crossover operator to a pair of genes P1 and P2 randomly selected out of plural genes. At this time the crossover operator references only the information of chip area in the genes P1 and P2 and searches portions having a common partial set of chip areas, regardless of the exposure order. In this case the scan direction in each chip area is not considered (or is not necessary). The third unit to the sixth unit of the gene P1 are a set of chip areas C, D, E, and F. Further, the fourth unit to the seventh unit of the gene P2 are also a set of chip areas C, D, E, and F. Although the scan direction in the chip area F in the gene P1 is opposite to that in the chip area F of the gene P2, it does not matter herein.

These common portions (subtours) are exchanged between the gene P1 and the gene P2. Namely, new genes of C1 and C2 are generated. In this embodiment genes C1 and C2 are further generated by inversion of the partial information of the exchange portions in the genes C1 and C2. Namely, the two parents have four children.

Figure 11:
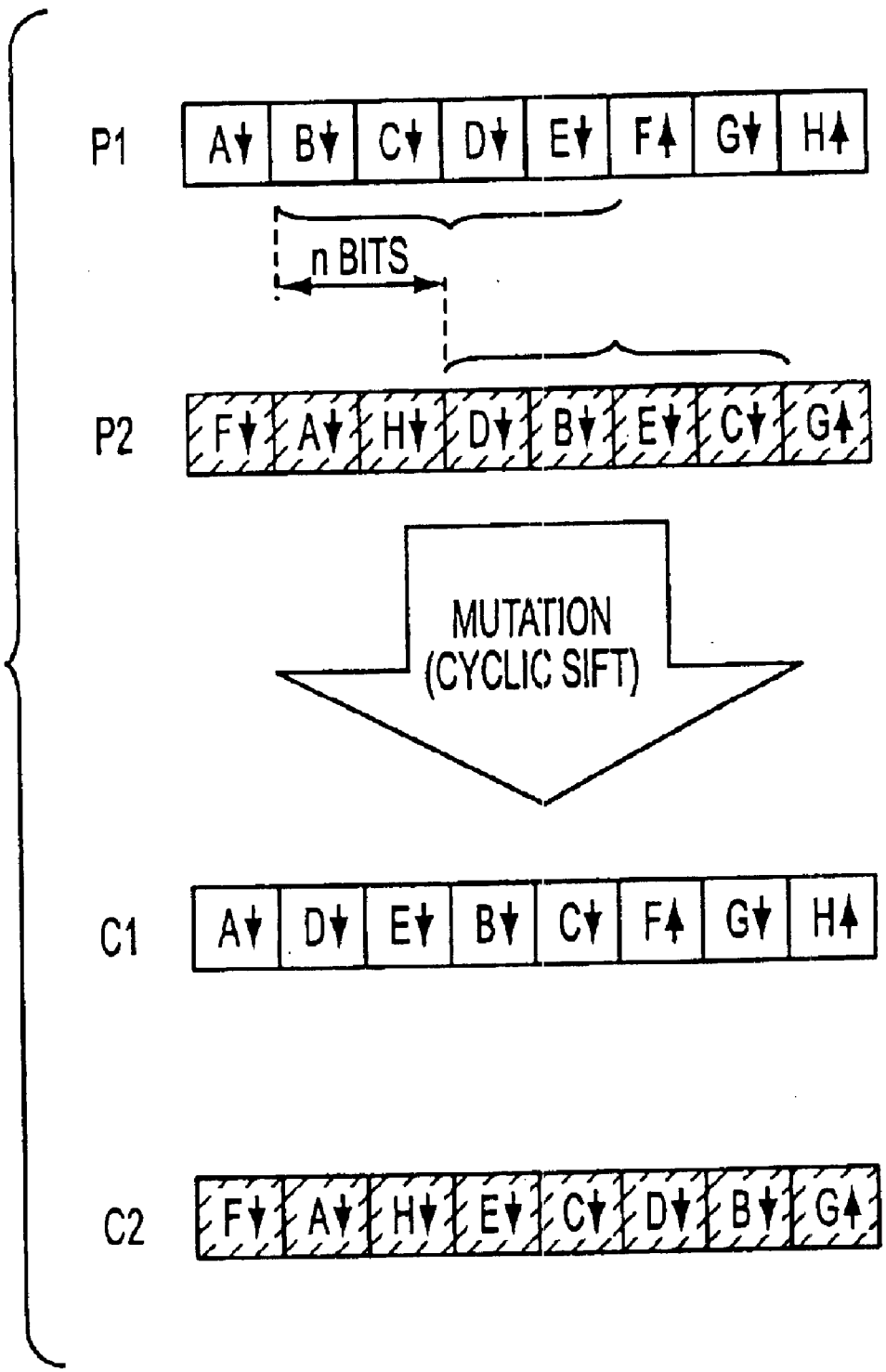
FIG. 11 is a drawing for explaining a mutation (Cyclic Shift) operator for improving the movement order between object areas.

FIG. 11 is a drawing for explaining a mutation operator, which is one of the genetic operators. The concept of the mutation operator is to generate children having characteristics that their parents do not have. FIG. 11 illustrates the mutation operator, particularly, for improvement in the movement order of object (the exposure order of chip areas: cyclic shift). The mutation operator adds a predetermined alteration to a pair of genes P1 and P2 randomly selected out of plural genes.

This mutation operator first references only the information of exposure position in the genes P1 and P2 and searches portions having a common partial set of exposure positions, regardless of the order. In FIG. 11, the second unit to the fifth unit of the gene P1 are a set of chip areas B, C, D, and E, while the fourth unit to the seventh unit of the gene P2 are a set of chip areas B, C, D, and E. Thus, the two sets are identical.

A difference of units between such partial strings appearing in the genes P1 and P2 is used as a number of shifts. In FIG. 11 the partial string starts from the second unit in the gene P1 while the partial string starts from the fourth unit in the gene P2; therefore, there is the difference of two units and thus the number of shifts is 2. Then the units appearing in the partial set of exposure position are shifted in order and in cycle by the number of shifts, thus generating the genes C1 and C2. This means that the gene C1 is obtained in such a way that the partial set of B-C-D-E in the gene P1 is shifted once to be C-D-E-B and then it is shifted once more to be D-E-B-C. The gene C2 is also obtained in the same way.

Figure 12:
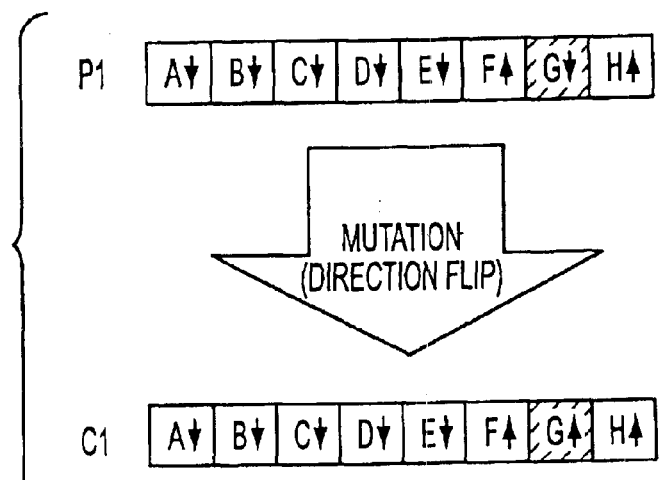
FIG. 12 is a drawing for explaining a mutation (Direction Flip) operator for improving the scan direction in each object region.
Figure 13:
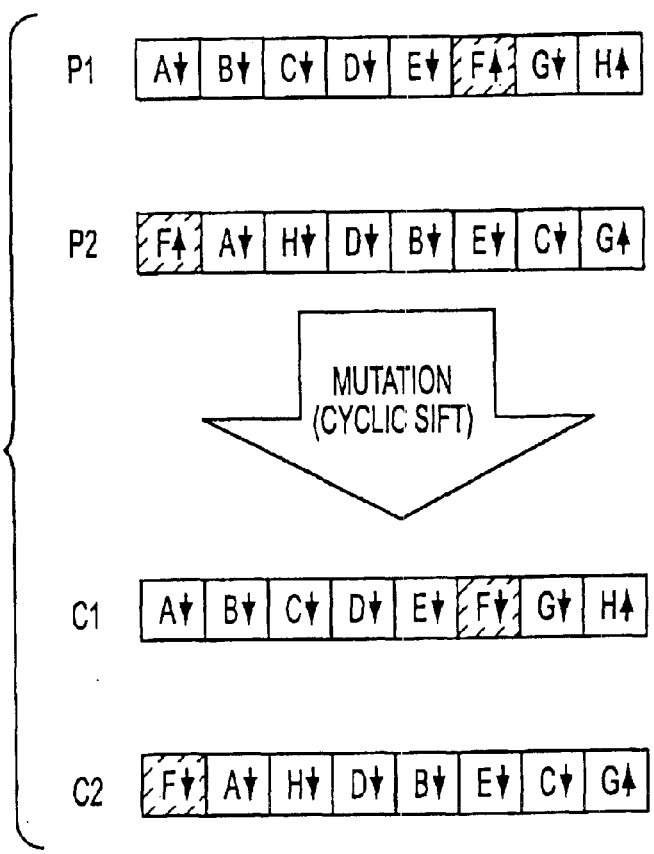
FIG. 13 is a drawing for explaining a mutation operator replacing the mutation (Direction Flip) operator shown in FIG. 12.

Next described with FIG. 12 and FIG. 13 is a mutation operator: Direction Flip (inversion of exposure scan direction), which contributes to improvement in the scan direction of exposure process in the object. This operator inverts the scan direction for a specific chip area of an object gene, for the purpose of search for the scan direction. In order to increase the search speed by the genetic algorithm, the better the smaller the size of the gene group, but it leaves a concern about "omission" of search by that degree. In order to avoid it, it is important to maintain the diversity of information in the gene group in the search by the crossover operator.

This is because the crossover operator cannot use any information except for the information that the gene already possesses. It is considered to be very rare that the effect achieved only by the inversion of scan direction can generate a better gene than before the inversion. However, this inversion contributes to maintaining the diversity of information (the scan directions in a specific chip area) within the gene group, and thus the size of the gene group can be restrained. Therefore, the computation turnaround time can be decreased thereby.

FIG. 12 illustrates a mutation operator for the scan direction in each chip exposure. This mutation operator randomly selects one gene P1 out of plural genes, selects an arbitrary chip area, for example the chip area G, out of chip areas without a constraint on the scan direction in the gene P1, and then generates a gene C1 by inverting the scan direction of the chip area G.

FIG. 13 also illustrates another mutation operator for the scan direction in each chip area, similar to FIG. 12, which is modified in the way of selecting the chip area as an inverted object of scan direction. This technique is for increasing the computation efficiency by preferentially inverting the scan direction of a chip area with a high possibility of having lost the diversity of scan direction. In one application of the mutation operator plural (two in the same drawing) genes are sampled; if the scan directions are identical or partial in the same chip areas existing in the respective genes, the scan directions of the chip areas are regarded as those having lost the diversity also in the entire gene group; and the scan directions of the chip areas are positively inverted. Every time the mutation operator is applied by the number of mutations, such sampling is carried out by sampling with replacement (wherein a same gene can be an object of mutation plural times).

Namely, the mutation operator shown in FIG. 13 applies the mutation operator to a pair of genes P1 and P2 randomly selected from the plural genes. This mutation operator checks the scan directions of the all chip areas in the genes P1 and P2 and searches chip areas having the same scan direction in the gene P1 and in the gene P2 and having no designation of scan direction. Then it generates the gene C1 and/or the gene C2 in which the scan direction in the chip area is inverted. In FIG. 13 the scan directions of the chip areas of the both gene C1 and gene C2 are inverted.

The contents of each operator were detailed above and now, returning to FIG. 8 and FIG. 9, the procedures of application of each operator will be described.

First, genes of a gene group consisting of genes numbering N preliminarily set (for example, N=26) are generated randomly (step ST12 or ST120). Each gene in this group is a solution to satisfy the condition that one exposure is done in each of n (for example, n=26) chip areas and to satisfy constraints on the scan direction for chip areas with designation of scan direction (such a solution to satisfy the constraints will be called a "constraint satisfying solution" or "feasible basic solution"). Each of the genes can be a solution generated (or updated) by the Lin and Kernighan's algorithm (hereinafter referred to as the LK method the details of which will be described hereinafter) with an initial solution being a constraint satisfying solution generated by an approach based on the rule of thumb, an approach based on the linear programming method (for example, the nearest neighbor method which will be called the NN method and the details of which will be described hereinafter, or the like), or generated arbitrarily; or a solution generated (or updated) by the LK method with an initial solution being a constraint satisfying solution generated by the approach based on the linear programming method (for example, the NN method or the like). Since the generation t at this time is t=1, the gene group of the first generation will be called G1. The turnaround times are computed for exposures of individual genes in the gene group G1 of the first generation. For example, the turnaround times are 25.325 sec for the first gene, 25.396 sec for the second gene, . . . , 23.826 sec for the twenty fifth gene, and 24.422 sec for the twenty sixth gene.

In one alteration of generation, first, crossovers are carried out in the number of crossovers according to a crossover rate preliminarily set (Pc=0.5): N×Pc times (26×0.5=13 times) out of the group of the N (=26) genes. A pair of (two) genes as objects of one crossover are preferentially sampled without replacement (or without permitting crossover of same gene) from the shortest turnaround time out of the gene group. This selection of the paired genes is carried out the number of crossovers times by sampling with replacement (permitting one gene to be selected plural times for different pairs) out of the gene group. One of specific applicable methods for preferentially selecting the genes of short turnaround time for exposure is the roulette wheel selection described in step ST44 or ST440. Another applicable method is a method for selecting N×Pc×2 genes in order from the shortest turnaround time for exposure and randomly selecting N×Pc gene pairs therefrom.

When the crossover operator is applied to each of these gene pairs (step ST16 or ST160), new genes numbering N×Pc×2 (26×0.5×2=26) are generated. This operator produces a group A of new-born genes (=N×Pc×2) (step ST18 or 180).

Next, "mutations for ordinal shifts of chip areas" are carried out A×Pm1 times (26×0.2=5.2 times: which is raised to an integer, 6) according to a rate of "mutation of ordinal shift of chip area" preliminarily set (Pm1=0.2) out of these new-born genes. Selection of one gene as an object of one "mutation of ordinal shift of chip area" is carried out by random sampling with replacement (permitting one gene to be selected as a mutation object plural times) out of the gene group (step ST20 or ST200: selection 2). When the "mutation operator of ordinal shift of chip area" is applied to the six genes selected (step ST22 or ST220), new genes numbering A×Pm1 (six genes) are generated. This operator produces a group B of new-born genes (=A×Pm1=N×Pc×2×Pm1) (step ST24 or ST240).

The above steps so far produced the genes numbering A+B=N×{1+2Pc(1+Pm1)}; the newborn gene group A (26) produced in step ST18 or ST180 and the new-born gene group B (6) produced in step ST24 or ST240 (step ST26 or ST260). With these new-born gene group A and new-born gene group B, the operation of "mutation for scan direction" is carried out Pm2×N×{1+2Pc(1+Pm1)} times (32×0.2=6.4 times, which is raised to an integer) according to a rate of "mutation for scan direction" preliminarily set (Pm2=0.2). One gene (in the case of the mutation operator shown in FIG. 12 being used) or a pair of two genes (in the case of the mutation operator shown in FIG. 13 being used) as an object or objects in one "mutation for scan direction" are randomly sampled with replacement (step ST28 or ST280: selection 3). When the mutation operator shown in FIG. 13 is used, because this mutation operator requires a pair of two genes, the way of selecting the two genes in one mutation operator is sampling without replacement, but the way of selecting a pair of two new genes in another pair is sampling with replacement (i.e., one gene can be selected plural times in different pairs). As described, the operator of "mutation for scan direction" described in FIG. 13 is applied (step ST30 or ST300), thereby producing new genes numbering (A+B)×2×Pm2 (twelve genes). (If the mutation operator of FIG. 12 is used, (A+B)×Pm2 new genes (six genes) are generated.) This operator produces a group C of the new-born genes (the number of genes in the group C is (A+B)×2×Pm2=N×{1+2Pc(1+Pm1)}×2 Pm2)(step ST32 or ST320).

By the process heretofore, there are the gene group G1 of the first generation (N=26), the new-born gene group A (26), the new-born gene group B (6), and the new-born gene group C (12). Totally, there are the genes numbering N×{1+2Pc(1+Pm1)}×(1+2 Pm2) (seventy genes) (step ST34 or ST420).

In the flowchart shown in FIG. 8, the steps up to this point correspond to multiplication of new-born genes by the genetic operators. In the flowchart shown in FIG. 9, multiplication by the LK operator detailed hereinafter is introduced immediately after it.

After completion of multiplication of new-born genes in each generation (i.e., In one loop in the flowchart shown in FIG. 8 or FIG. 9), in the final step of the loop a survival process is carried out to select genes to be left as a gene group of the next generation (i.e., a starting gene group in the next loop) and to dismiss the other genes (step ST44 or ST440). Namely, the turnaround times are checked for the all exposure sequences corresponding to the individual genes included in the new-born gene group A, new-born gene group B, and new-born gene group C generated by the genetic operators (the new-born gene group D is further added in the case of the flowchart shown in FIG. 9) in addition to the initial gene group $G_t$, thereby obtaining one gene representing the best exposure sequence, i.e., an exposure sequence having the shortest turnaround time among them. At this time, if S different genes all are the best, these S genes are left unconditionally in the next generation. Further, (N-S) genes are also selected out of the remaining (70-S) genes by such a selecting method as to select a gene corresponding to an exposure sequence of a shorter turnaround time more preferentially and are left in the next generation (i.e., in the (t+1)-th generation). Namely, the survival process of gene is carried out so as to select totally N genes including the exposure sequence of the shortest turnaround time and the other sequences (step ST44 or ST440). This selection method is not one for selecting N exposure sequences from the shortest turnaround time, but is one for selecting epistatic exposure sequences with a higher priority but still leaving a possibility of selecting a hypostatic exposure sequence (of longer turnaround time), though low. The reason why a hypostatic exposure sequence is also selected is that the true optimum solution is not always derived from a group of epistatic exposure sequences, but is possibly derived from a group of hypostatic exposure sequences. Meanwhile, if a solution derived from a hypostatic exposure sequence is also still hypostatic in the next generation, it will be naturally dismissed. Therefore, it will not be a hindrance against finding of the true optimum solution. The roulette wheel selection can be applied as a selection method of this type. For example, supposing there are three candidates X, Y, Z as solutions of movement sequence in the optimization problem of movement sequence and their turnaround times of movement are 10 sec, 20 sec, and 20 sec, respectively, it is contemplated that the inverse of the time is set as a fitness value of each solution. At this time, supposing one solution is selected out of these three solutions by roulette wheel selection, probabilities of selection of the solutions X, Y, and Z are 0.5, 0.25, and 0.25, respectively.

The twenty six new genes thus selected compose a set of genes of the next generation, $G_{t+1}$. Then, returning to step ST14 or ST140, the same process with the genetic operators is repeated.

As apparent from the algorithm to repeat this alteration of generation, for example, supposing exchange of reticle takes 10 sec and within that period the computation is completed, for example, up to the fortieth generation, the shortest exposure sequence can be obtained among the group of genes (solutions) of the fortieth generation. Supposing exchange of reticle takes 11 sec and within that period the computation is completed up to the forty first generation, the shortest exposure time can be obtained among the group of genes (solutions) of the forty first generation.

Further, as shown in FIG. 9, the LK method can be incorporated as one of the genetic operators into the genetic algorithm in order to obtain the optimum solution or the best solution more efficiently. In this case, the LK1 method (hereinafter referred to as an LK operator) is applied, for example, to the all genes in the gene group including the new-born genes obtained by the application of the crossover operator and mutation operators (step ST380). Thus, a new-born gene group D (the number of new-born genes included in D is N×2Pc(1+Pm1)}×(1+2 Pm2)) is newly produced herein (step ST400). Namely, immediately before the survival, there exist genes numbering 2N×2Pc(1+Pm1)}×(1+2Pm2) (Step ST420). The preset crossover rate Pc, the preset mutation rates Pm1, Pm2, the genetic algorithm, etc. are stored in the memory 17 (FIG. 1).

Since the above embodiment minimizes the turnaround time upon exposure of plural chip areas on one wafer by applying the genetic algorithm to the scan exposure type projection exposure apparatus, it makes possible simultaneous scheduling of the exposure order (path) of each chip area and the operation of reticle synchronized with the exposure.

The present invention can also be applied to inspection apparatus for controlling changeover of a pallet in which a plurality of inspected objects (preparations etc.) are arrayed, a moving sensor (for example, a line sensor with scan perpendicular to a direction of a sensor array, or the like), or a revolver of plural reticles (or objective lenses), as a method to minimize the overall turnaround time for movement of inspecting point. In addition, the movement sequence determining method according to the present invention can also be applied to cases of selecting one out of multiple choices of reticle-side operations, for example, cases of the one-shot exposure type projection exposure apparatus wherein plural reticles are applied in different orders (assuming that orders of use of the plural types of reticles are preliminarily prepared) to each of the chip areas, and to cases of the scan exposure type wherein the plural reticles are applied in different orders (assuming orders of use of the plural types of reticles are preliminarily prepared) to each of the chip areas.

In the present embodiment the local search by the crossover operator is merged with the global search by the mutation operators and the two movement items of the stage and reticle are handled simultaneously, thereby the movement sequences of the two stages correlated with each other can be optimized simultaneously. In addition, since the best solution of each generation is presented every alteration of generation by the genetic algorithm, a near-optimum solution consistent with a computation time can be obtained even with interruption of computation within the allowed computation time.

For the purpose of eliminating even a little wasteful motion of the wafer stage 14 and reticle stage 9 to shorten the overall turnaround time of exposure sequence more, the following method can be employed, considering elimination of temporary suspension every completion of scan exposure in each chip area in the present embodiment.

Namely, noting periods before and after the period of irradiation to the exposure light in scanning exposure for each chip area (in which the wafer stage 14 and reticle stage 9 both are normally undergoing the Y-directional constant-speed movement in synchronism), a unit movement sequence turnaround time can be assigned to a time from the point of end of the foregoing period in the scanning exposure in one chip area to the point of start of the next period in scanning exposure in the next chip area. Also in this case, the optimum movement sequences of the wafer stage 14 and reticle stage 9 to minimize the respective unit movement sequence turnaround times can be obtained uniquely, so that a table storing the unit movement sequence turnaround times (see FIG. 7) can also be obtained uniquely. Accordingly, as in the above embodiment, if the scan direction in each chip area and the exposure order of each chip area both are determined with optimality, the movement sequence to minimize the overall turnaround time for the series of exposure sequences can be obtained.

The crossover operator, SXX, in the present embodiment can be replaced by another crossover operator used in approaches to TSP, such as OX: Order Crossover (L. Davis, "Applying Adaptive Algorithms to Epistatic Domains," Proceedings of International Joint Conference on Artificial Intelligence (IJCAI), 1985), PMX: Partially Mapped Crossover (D. E. Goldberg and R. Linge, "Alleles, Loci, and the Traveling Salesman Problem," Proceedings of International Conference on Genetic Algorithms (ICGA), 1985), or EAX: Edge Assembly Crossover (Nagata, Ono, and Kobayashi: "Proposal and evaluation of edge assembly crossover: New crossover of TSP considering tradeoff between character heredity and degree of freedom of crossover," System and Information Joint Symposium '96, Keisoku Jido Seigyo Gakkai, 1996).

Describing further, the genetic algorithm can also be applied to optimization of order of exposure in the one-shot projection exposure apparatus. In this case, no consideration is necessary on the scan direction and the computation becomes easier. Namely, for obtaining the overall turnaround time of exposure sequence of the optimum solution, only one point to be considered is the optimum exposure order (in the sense to minimize the final exposure sequence) as long as a two-dimensional table storing shortest movement times (i.e., shortest movement times between two arbitrary chip areas) for arbitrary unit movement sequences can be preliminarily prepared. Each shortest movement time between chip areas can be computed easily and uniquely from highest movement velocities and maximum accelerations of movement along the X-direction and the Y-direction of stage. With n chip areas, the all shortest movement times between chip areas can be obtained by n×(n−1) computations (or at most n×(n+1) computations even in the case wherein the positions of the wafer stage are designated before and after the series of exposure sequences). In the case of the one-shot exposure type projection exposure apparatus, since only the movement sequence of the wafer stage 14 is the object of the optimization, there is a high possibility of showing no prominent difference in the computation time to find the optimum solution from the conventional approach, when compared with the case of the scan exposure type projection exposure apparatus (also necessitating simultaneous consideration on movement of the reticle stage). However, its effectiveness will appear, for example, when the user of the one-shot projection exposure apparatus designates arbitrary (plural) chip areas as those not necessitating exposure; and it is meaningful that in this case a near-optimum solution consistent with the computation time can be outputted even with interruption of computation within the allowed computation time.

For clearly expressing the difference between the result obtained by the movement sequence determining method according to the present invention and the result obtained by the conventional approach, the following description concerns (1) the difference of exposure path (i.e., the difference in a path of a locus drawn by the center point of exposure light on the coordinate system of one wafer) and (2) the difference in the overall turnaround time of exposure sequence necessary for exposure of one wafer.

Figure 14:
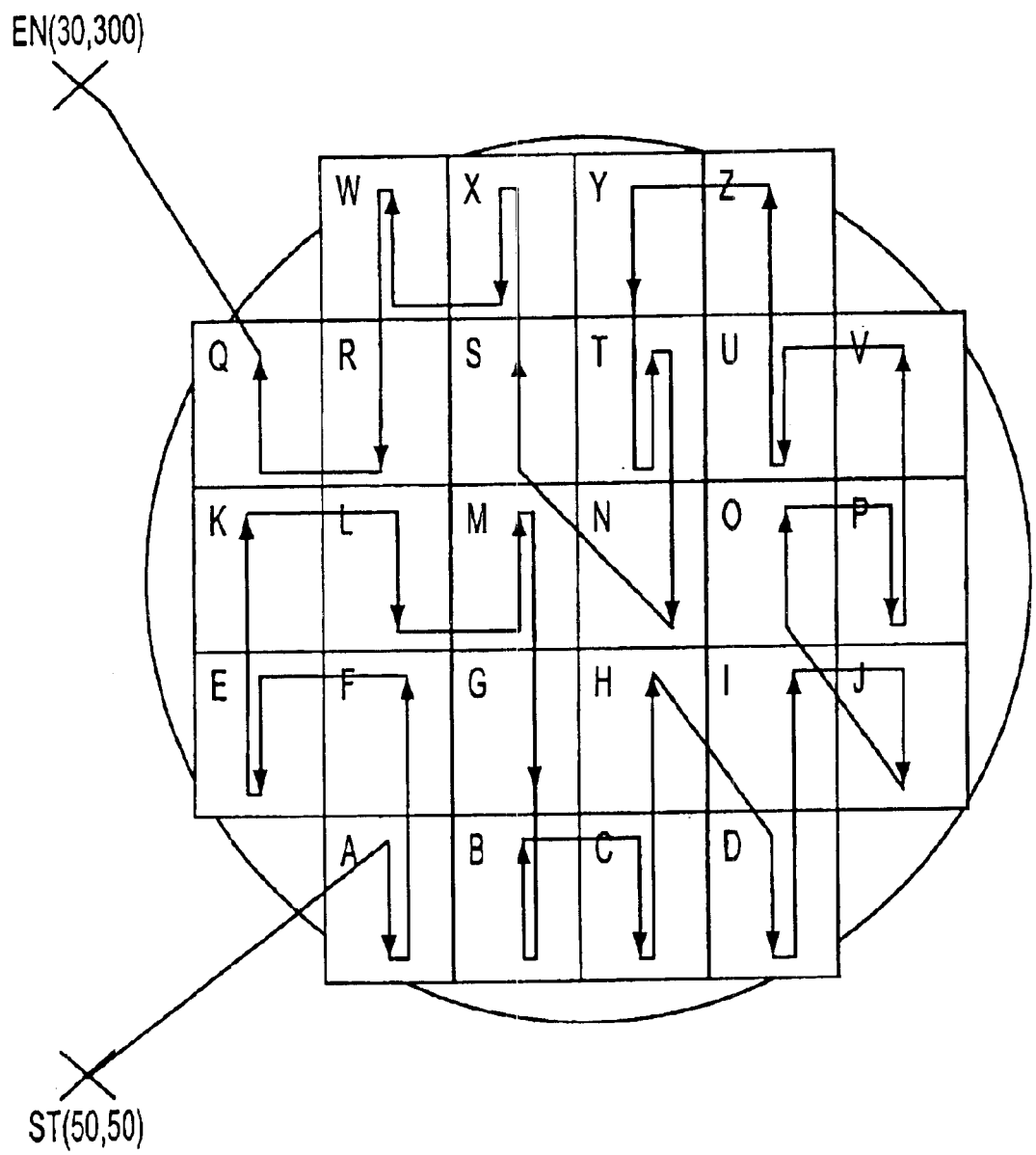
FIG. 14 is a drawing to show a movement sequence obtained by the movement sequence determining method according to the present invention.

For guaranteeing the true optimum solution, all constraint satisfying solutions (feasible basic solutions) that can be generated must be checked and it requires enormous computational complexity, which is not practical. For examination, alterations of generation, which seemed sufficient to converge, were made in the GA using the MGG model under such preset conditions that the group size was somewhat large, the crossover rate was somewhat high, and the mutation rates were sufficiently high in comparison with the group size. When the alterations of generation were made with a sufficient time from a starting group generated at random, the convergent solution (the true optimum solution) was given as shown in FIG. 14, in which the route passed the nearest chip areas after or before the start point ST and the end point EN and in which there existed no seemingly long path. The turnaround time was 16.974 sec. After that, the convergent solution this ime was handled as a substitute for the "true optimum solution." In this GA the computation was continued up to the 800th generation (for about three hours) under the setting conditions that the group size N was N=100, the crossover rate Pc was Pc=0.5, and the two mutation rates Pm1 and Pm2 were Pm1=0.3 and Pm2=0.3, respectively. A solution regarded as the convergent solution first appeared near the 380th generation and approximately one and a half hours were consumed up thereto.

This GA can finally reach the optimum solution with sufficient time, but it cannot be applied to practical problems as it is. Thus, the approaches by the genetic algorithm shown in FIG. 8 and FIG. 9 and described above are arranged to achieve the optimum solution quickly.

Next described is the approach based on the evolutionary computation method utilized in the arithmetic step in the movement sequence determining method according to the present invention.

A starting group is first generated. Since the two-dimensional table (see FIG. 7) storing the shortest movement times for unit movement sequences reflects constraints on the scanning exposure, a gene indicating an arbitrary, feasible basic solution is obtained, for example, by randomly generating an exposure sequence that passes each chip area only once without overlap (even if different scan directions can be selected in a single chip area) by reference to the table. Using plural genes (each of which is a feasible basic solution) generated randomly as a starting group, preliminary experiments were repeated with different group sizes, crossover rates, and mutation rates. Then it became possible to produce the optimum solution within about 10 sec under the setting conditions that the group size=the number of chips, the crossover rate=0.5, the shift mutation rate=0.2, the mutation rate of inversion of scan direction=0.2, and the LK operator was applied to the all genes.

Further, when solutions obtained by the LK method were used as initial solutions, solutions better than those by the LK method were generated stably within 2 sec and the optimum solution was generated within 5 sec.

A solution by the NN method+the LK method (i.e., the LK method using the solutions obtained by the NN method as initial solutions) is highly probably a local solution (which is a locally optimum solution, but is not the true optimum solution, i.e., not the globally optimum solution) in the optimization problem of movement sequence in the scanning exposure. Accordingly, there is a risk that in the global search the GA could bias the search space of solution (i.e., it could perform a search biased to the vicinity of the local solution). It is thus desired in order to avoid the biased search that a good solution of a completely different exposure sequence be also added to the starting group, as well as the best solution by the NN method+the Lk method. If a solution is not good in quality though being of a completely different exposure sequence, it will soon be selected to vanish in the GA. Therefore, it was contemplated that out of (plural) solutions by the NN method in plural applications with various search start points and (plural) solutions by the LK method in plural applications with various initial solutions, many solutions that were not best in such solutions were also added to the initial group.

This example employs the method (the roulette wheel selection) for preliminarily limiting the upper limit of the maximum candidate number of solutions to q, applying the LK method to only q epistatic solutions from the shortest exposure sequence turnaround time out of the solutions obtained by the NN method (to obtain q solutions thereby), and probabilistically sampling without replacement solutions in the group size (N) in probabilities consistent with evaluation values of the respective solutions. Then solutions numbering N=26 were selected out of solutions numbering q=200 by the roulette wheel selection and were used as a starting gene group in the GA. The result achieved by the above method was the same exposure sequence as shown in FIG. 14, in which the overall turnaround time of the entire exposure sequence (from the start point ST to the end point EN) was 16.974 sec. This means that the solution obtained in about 4 sec by the genetic algorithm shown in FIG. 9 was the same as the true optimum solution obtained 1.5 hours after by the GA of the MGG model.

Further, FIG. 15 to FIG. 18 are drawings to show movement sequences obtained by the conventional approach. The conventional approach is based on an exposure sequence in which the turnaround time of the series of exposure sequences is the shortest (or very short) under specific conditions. It is used with such empirical hopes that a new exposure sequence obtained by partially changing the initial sequence so as to satisfy a constraint arbitrarily added may not be the optimum solution under the arbitrarily added constraint, but should be a good solution to some extent. Therefore, this technique will be referred hereinafter as an "approach based on the rule of thumb."

The approach based on the rule of thumb will be described briefly herein. In the scan exposure type projection exposure apparatus, for example, when the moving velocity and acceleration of the wafer stage 14 in the X-direction are greater than those in the Y-direction, the exposure sequence is determined by using two empirical rules specific to the optimization problem of exposure sequence described below. In this case, item (1) below is given a first priority in practice and item (2) below is employed within the range satisfying the item (1).

(1) Since the chip areas are regularly arrayed in a grid pattern, a rough route is such that exposures are carried out in order from the bottom (or the top) to the left edge (or the right edge). Namely, process directions are such that a series of chip areas arrayed in a line (continuously in the X-direction) are exposed, then the exposure light is shifted in the Y-direction to the next line, then it moves in the opposite direction, and so on.

(2) Since movement of the reticle without any exposure process could waste the time, such operation is avoided as much as possible. For that purpose, when plural chip areas arrayed in a line are exposed, a chip area of an exposure object is scan-exposed in an opposite direction to that of a previous chip area if there is no designation of scan direction. Accordingly, in the case of one line consisting of chip areas without any designation of scan direction, exposures are carried out while successively inverting the scan directions, from forward to backward, and vice versa.

The rule of thumb employed herein is based on some practical examples, considering patterns to realize partially shortest time paths. For example, when the moving velocity and acceleration of the wafer stage 14 in the X-direction are greater than those in the Y-direction as described above, a solution obtained could be one of true optimum solutions during exposures of the all chip areas without designation of scan direction. Even if the solution is not a true optimum solution because of differences in conditions due to the performance of stage, a moderately good solution can be expected. The approach based on the rule of thumb is quick in terms of the computation turnaround time, but lacks the optimization fully taking account of the various conditions including the performance of stage, the constraints arbitrarily given by the user of projection exposure apparatus, and so on.

Figure 15:
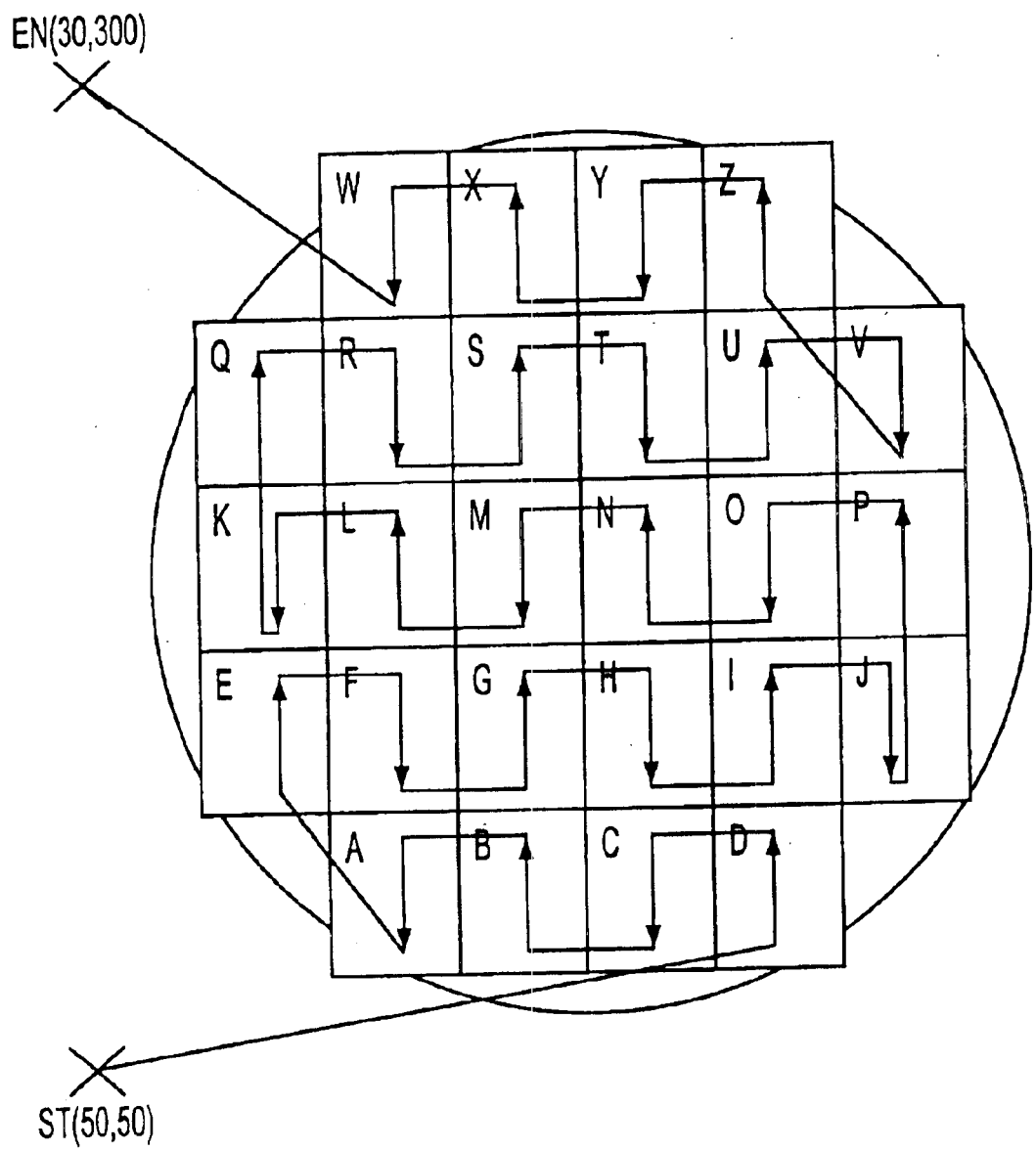
FIG. 15 is a drawing to show a first comparative example of a movement sequence obtained by an approach based on the rule of thumb.
Figure 16:
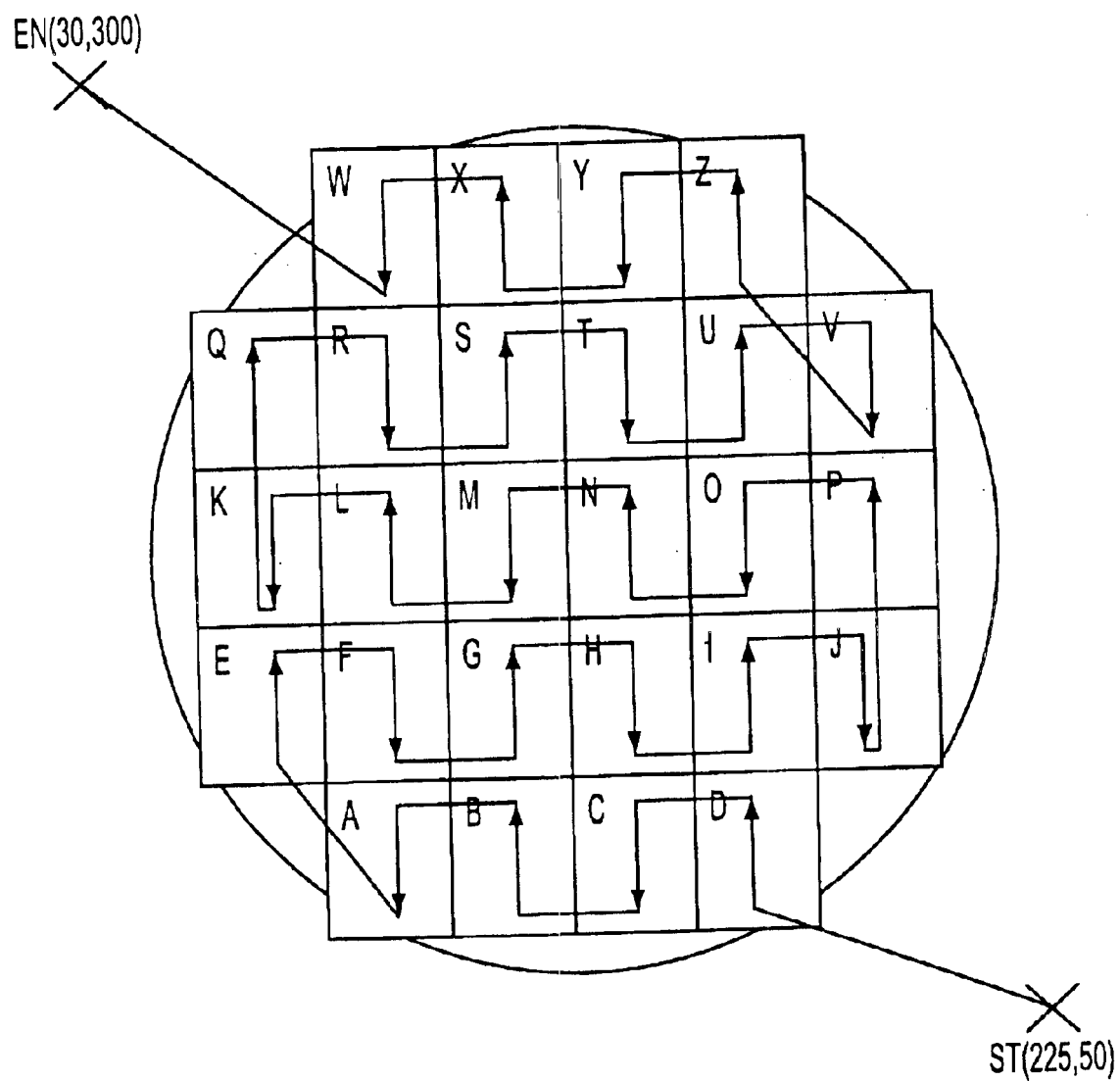
FIG. 16 is a drawing to show a second comparative example of a movement sequence obtained by the approach based on the rule of thumb.

The solution obtained by the approach based on the rule of thumb was, for example, as shown in FIG. 15, in which the overall turnaround time of the entire exposure sequence (from the start point ST to the end point EN) was 17.629 sec. In FIG. 15, the number of lines of chip areas is odd (where the chip areas A to D are in the first line, the chip areas E to J in the second line, . . . , the chip areas W to Z in the fifth line) and the start point ST and end point EN are not located at diagonal positions. This approach, therefore, has a problem that a considerably long path appears as seen from the start point ST to the chip area D. This problem can be avoided, for example, by setting the start point ST at the horizontally symmetric position. As a result, the movement sequence as shown in FIG. 16 (the overall turnaround time of the entire exposure sequence is 17.254 sec) is obtained. However, use of such means to avoid the problem requires change of another sequence (for example, the sequence of wafer alignment) immediately before the exposure sequence, thus involving a risk that undesired constraints are exerted on the other sequence.

Figure 17:
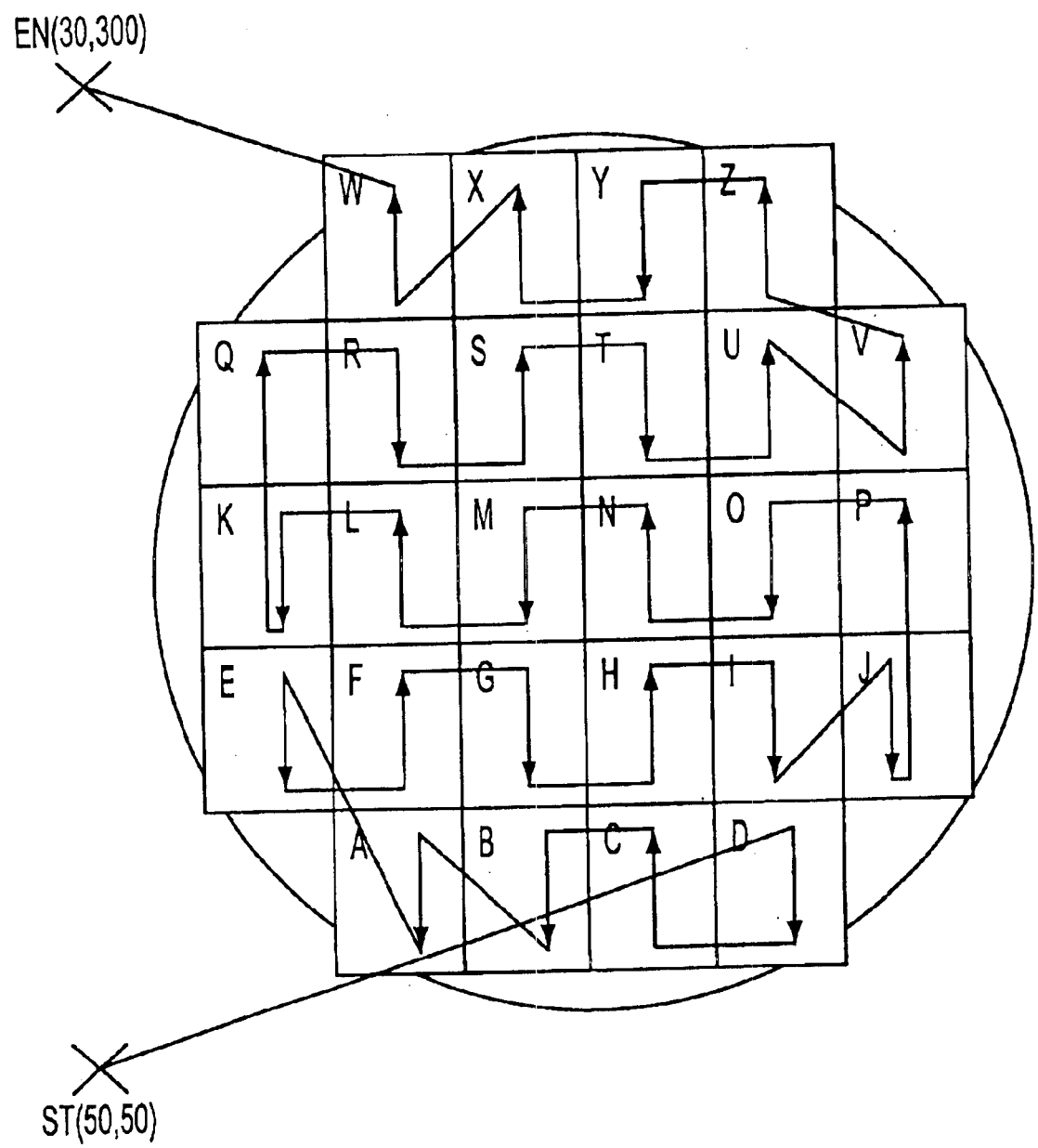
FIG. 17 is a drawing to show a third comparative example of a movement sequence obtained by the approach based on the rule of thumb.
Figure 18:
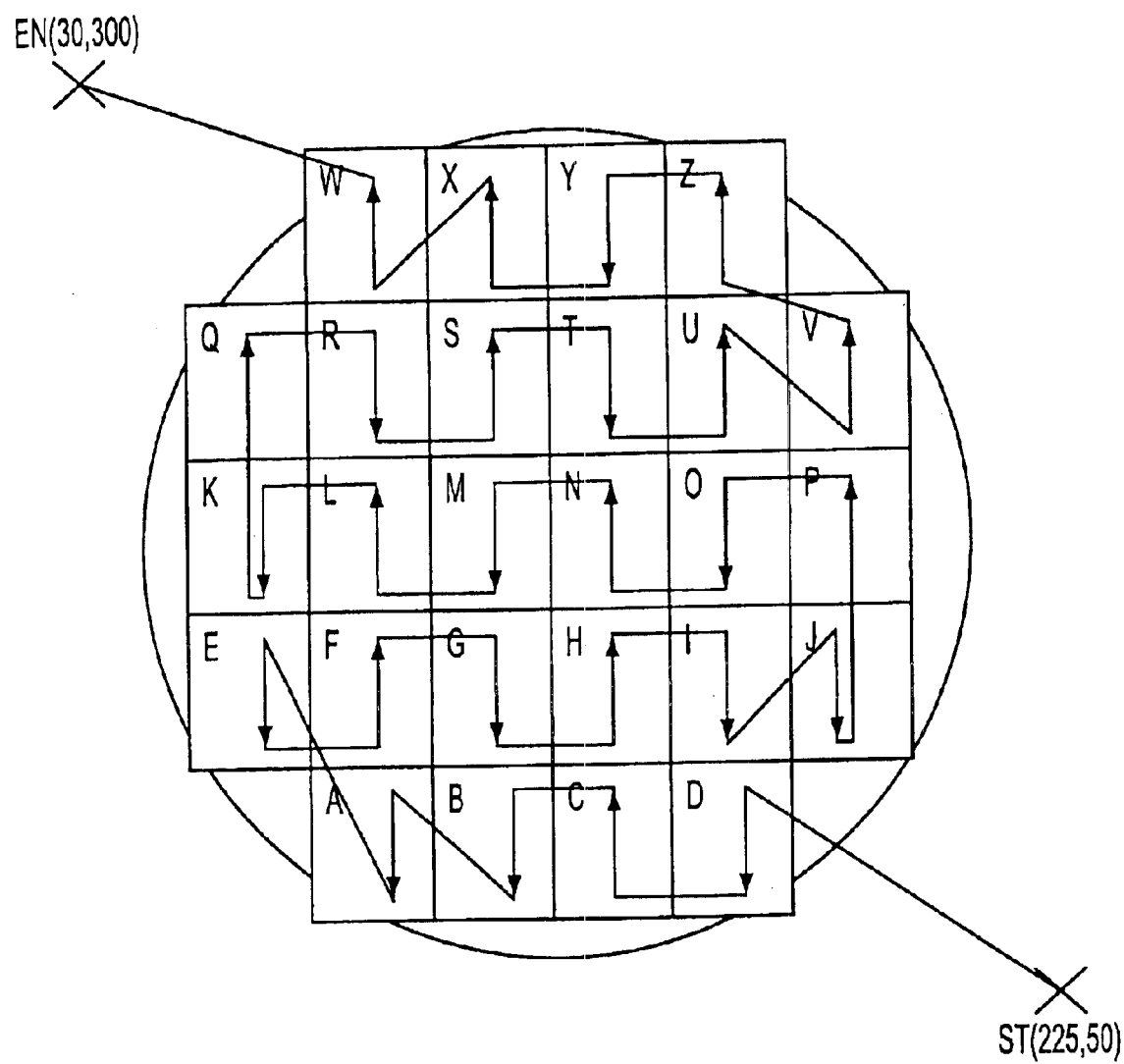
FIG. 18 is a drawing to show a fourth comparative example of a movement sequence obtained by the approach based on the rule of thumb.

With constraints arbitrarily given by the user of projection exposure apparatus, the movement sequences as shown in FIG. 17 and FIG. 18 are obtained by use of the approach based on the rule of thumb. FIG. 17 shows the movement sequence obtained where the start point ST and end point EN are not located at the diagonal positions and FIG. 18 the movement sequence obtained where the start point ST and end point EN are located at the diagonal positions. The overall turnaround times of the entire exposure sequences shown in FIG. 17 and FIG. 18 were 19.567 sec and 19.268 sec, respectively.

It is thus seen that by the approach based on the rule of thumb, the experimental setting of FIG. 17 results in the longest overall turnaround time of the entire exposure sequence. When the GA of the MGG model was applied under the same experimental setting, the optimum solution obtained thereby achieved the overall turnaround time of the entire exposure sequence of 16.974 sec, thus showing that the turnaround time was decreased by 2.593 sec.

The operations-research-like techniques will be described one by one.

Linear Programming Method: Nearest Neighbor Method (NN Method)

In the "optimization of exposure sequence," which is the object of the present invention, even if local partial exposure sequences are optimum, an exposure sequence having such partial exposure sequences as components will not be always an optimum exposure sequence. When this problem is solved by the linear programming method to obtain a solution, the resultant solution is not always the (global) optimum solution. However, it is a method for generating a good solution, or a local optimum solution very quickly and it is used as an effective near-optimum obtaining method where the point is to obtain a solution in short time. It normally has high general versatility and is readily applicable to the cases wherein an arbitrary constraint is given by the user of projection exposure apparatus described above, thus being a useful technique for solving practical problems.

The nearest neighbor method (the NN method), which is one of most popular search methods, will be described herein as an embodiment by the linear programming method. The NN method is a method for repeating such an operation as to arbitrarily select one starting point and choosing a nearest neighbor point thereto as a next point. A point selected once will be excluded in order from a candidate group of selection.

For example, supposing the first point is at an intermediate point of the exposure sequence, a search must be carried out in two ways, forward and backward, in the exposure order and there is a possibility that the forward and backward searches compete for one point simultaneously. This is not preferred, because it is not determined uniquely which search should be given the first priority at this time. Experiments were carried out for the two cases wherein the start point of search was at the start point ST and where the start point of search was at the end point EN. In the search process of the best unit exposure sequence, when there are plural candidates for the unit exposure sequence selected next (or when there are plural candidates having an identical and shortest movement turnaround time of unit exposure sequence for moving to a start point of scanning exposure in the next chip area) and if the all cases are searched, the search could be a search of all solutions in the worst case. For the purpose of decreasing the computation time by avoiding it, an idea to randomly select several points out of the next candidate points at each point (for example, in such a way of setting as to preliminarily select p points in the highest case and arbitrarily determine how to select points between 1 and p at each point) can be introduced.

For quickly carrying out the algorithm of this type, a table of movement patterns preliminarily contemplated is necessary. A movement turnaround time of each pattern is written in the table. With a list of candidates for movement from a certain point to a next point, it is effective to sort the candidates in the order of turnaround times from the smallest. This operation makes it possible to select points not having passed yet one by one from the top of the candidate list. The same table of movement patterns is also utilized for increasing the efficiency of calculation of movement time similarly in the LK method and the evolutionary computation method.

A tendency anticipated is that the solutions by the NN method give many short partial paths near the start point of search and longer partial paths at points nearer to the end point. This is the reason why the two cases were checked by the experiments where the start point of search by the NN method was at the start point ST and where the start point of search thereby at the end point EN (the search in which the movement order of chip areas is opposite to the array order of chip areas).

Figure 19:
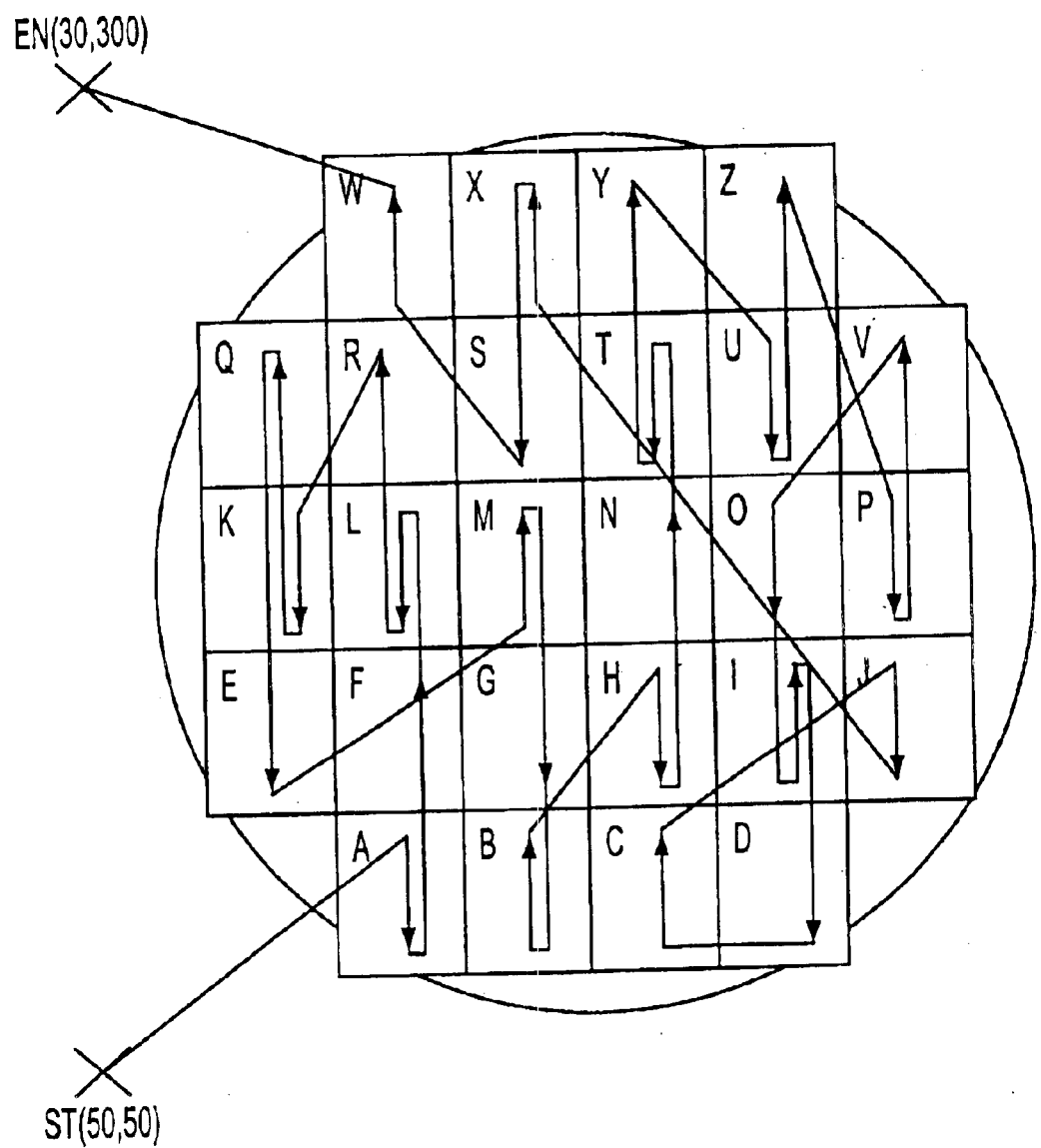
FIG. 19 is a drawing to show a movement sequence resulted from a "forward search" using the linear programming method (the NN method)
Figure 20:
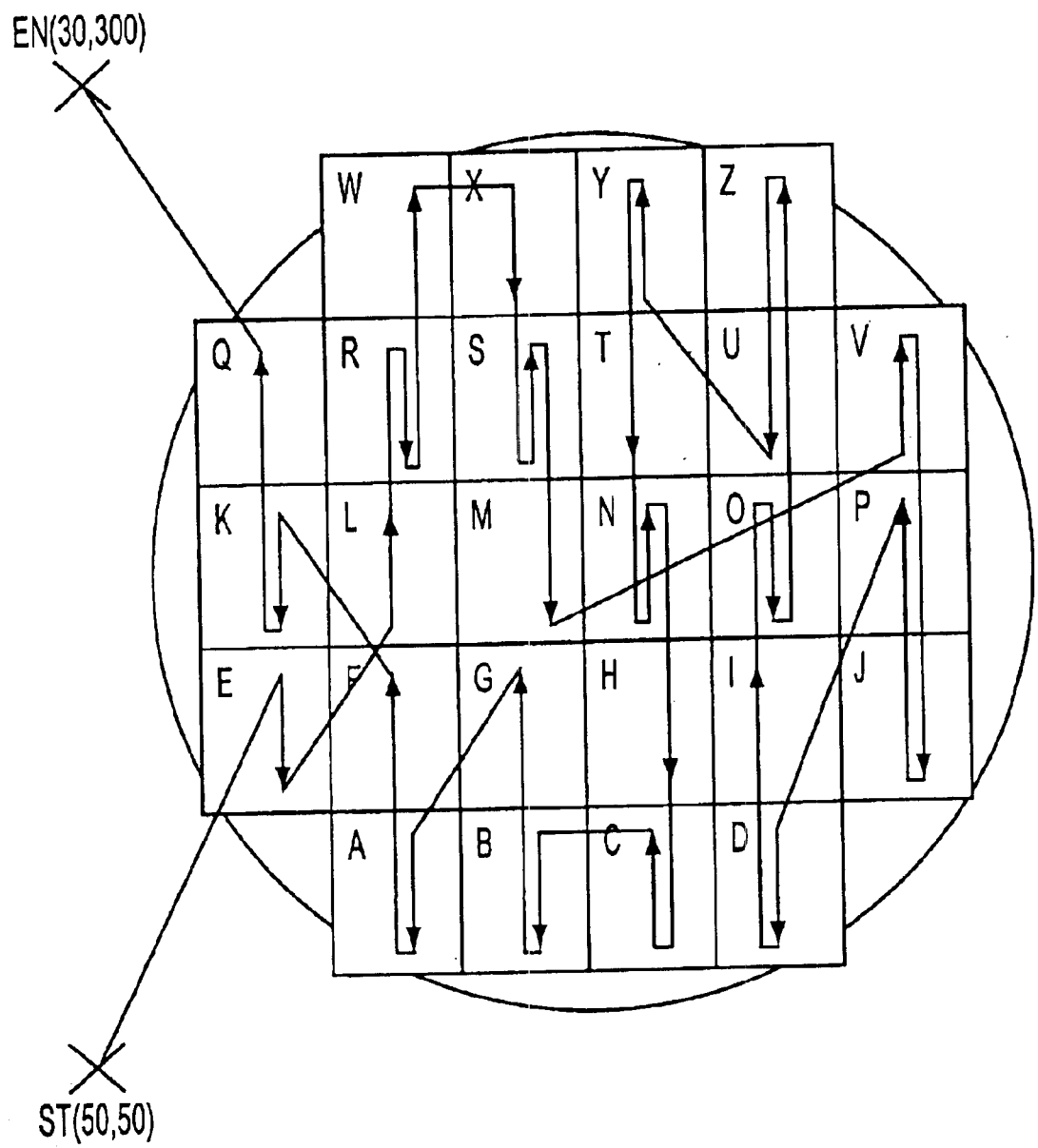
FIG. 20 is a drawing to show a movement sequence resulted from a "backward search" using the linear programming method (the NN method)
Figure 21:
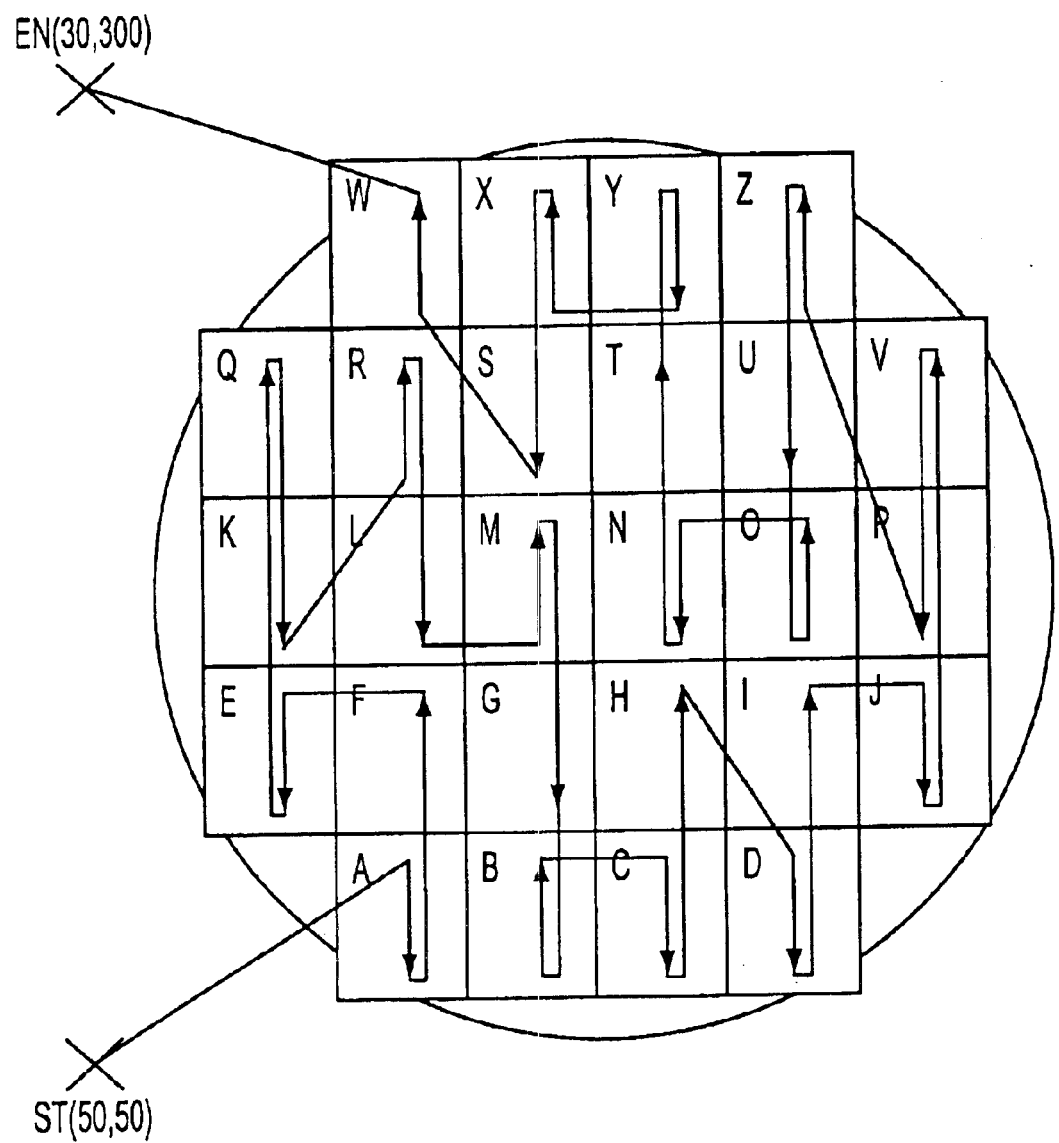
FIG. 21 is a drawing to show a movement sequence resulted from application of the Lin and Kernighan's algorithm (the LK method), using the solution obtained by the "forward search" of the NN method as an initial solution.
Figure 22:
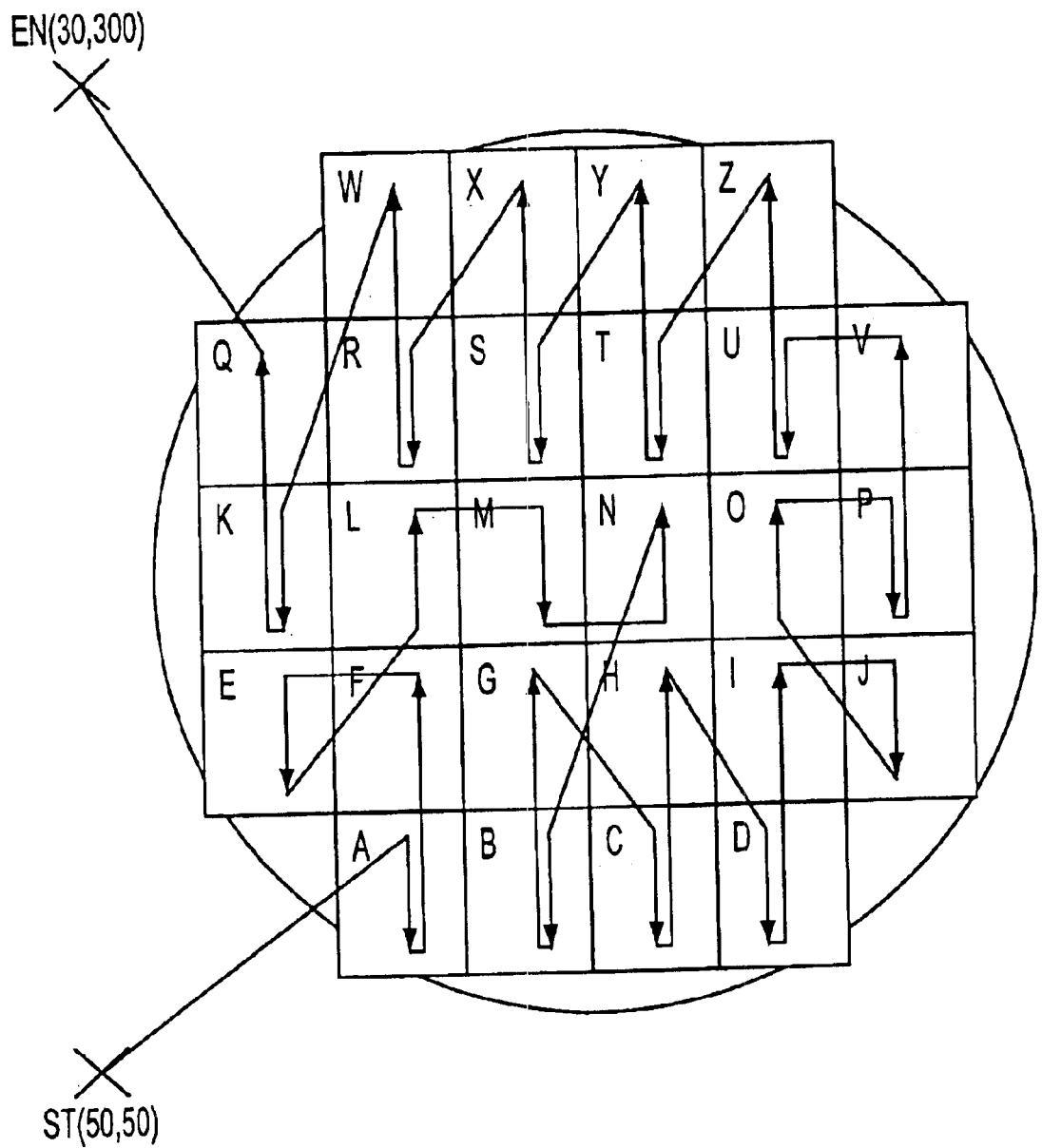
FIG. 22 is a drawing to show a movement sequence resulted from application of the LK method, using the solution obtained by the "backward search" of the NN method as an initial solution.

As a result of the experiments, the solutions by the NN method were produced in each of the "forward search" with the start point of search at the start point ST and the "backward search" with the start point of search at the end point EN. For confirmation, when in this embodiment the aforementioned number p was employed as the maximum candidate number at each point, i.e., when the search was conducted with the all candidates, 1665 solutions were generated in the "forward search" and 1455 solutions in the "backward search." In these solutions numbering 3120 in total, the diversity was recognized in the scan directions in the respective chip areas and the diversity was also in the movement orders of chip areas owing to the diversity of scan direction. FIG. 19 and FIG. 20 show the best solutions (movement sequences) in the respective searches.

The computation time until generation of these 3120 solutions was about 0.07 sec. As a result, the best solution in the forward search (with the start point of search at the start point ST) was the movement sequence shown in FIG. 19 and the overall turnaround time of the entire exposure sequence (between the start point ST and the end point EN) was 17.581 sec. On the other hand, the best solution in the backward search (with the start point of search at the end point EN) was the movement sequence shown in FIG. 20 and the overall turnaround time of the entire exposure sequence (between the start point ST and the end point EN) was 17.478 sec.

Lin and Kernighan's Approach (the LK Method)

The LK method is famous as a quick near-optimum obtaining method for symmetric TSP (Traveling Salesman Problem), i.e., as a technique capable of obtaining a near-optimum solution in very short turnaround time of computation and is a technique of development of the k-OPT method, which is the general name of the 2-OPT method and the 3-OPT method. Details of these techniques will be described hereinafter. The TSP is a problem: given an arbitrary city matrix for n (n>1) cities, find a minimum-length tour that visits each city only once and the all cities. There are symmetric and asymmetric TSPs. The symmetric TSP is a TSP for an object in which the overall pathlength is invariant even with inversion of the tour order from the sequential city visit order given for the matrix of n cities.

Conversely, the asymmetric TSP is a TSP for an object in which the overall pathlength will vary with inversion of the tour order from the above city visit order.

The TSP was originally the problem considered in order to minimize the length of the tour, for example, assuming that a matrix of cities are located randomly on a two-dimensional plane or the like. In such a city matrix space the shortest path between two arbitrary cities (i.e., an arbitrary unit path) is given uniquely by connecting the two cities by a straight line. This means that once the visit order of the cities is determined, the minimum-length tour path according to the visit order can be obtained uniquely. Namely, finding a city visit order (city permutation) to minimize the length of the path to visit the all cities is equivalent to obtaining a solution to the TSP. Therefore, even if the objective problem is not directed to minimization of the path itself (i.e., a distance in a physical space) and if it is converted to one equivalent to the optimization of permutation, the approach of TSP can be applied as it is.

For example, the technique of TSP can be applied as it is, to the problem to determine the exposure sequence so as to minimize the turnaround time for exposures of the all chip areas in the one-shot exposure type stepper. Since the movement along the X-direction and the movement along the Y-direction of the wafer stage can be made independently and simultaneously, the turnaround times of unit movement sequences in this case are not distances between two arbitrary chip areas, but those as stored in the unit movement sequence turnaround time management table described previously. Let us consider below application of the "LK method" which can be regarded as an improvement of the k-OPT method.

The NN method is a "generating method" to generate a solution from nothing, while the k-OPT method and LK method are "improving methods" for initially giving a certain initial solution (here, in the case of the "constraint satisfying problem" to require an output solution to satisfy a specific constraint, a necessary condition is that the initial solution is a feasible basic solution) and successively improving the solution. Particularly, the LK method is a method for repetitively performing such an operation as to extract a part of a tour sequence of the initial solution and to invert the partial order, thereby effecting repetitive improvements, even in a solution after improved, as long as an improvement is possible. In one improvement, if the sum of lengths of paths (two cut paths) at the both ends of the partial sequence extracted is smaller than that before the inversion; the length of the entire path will be shortened by the difference between them. Therefore, this method is efficient, because attention is focused on the lengths of the two cut paths and computation is unnecessary for the total pathlength. This single improvement is called 2-OPT. After accomplishment of 2-OPT, when 2-OPT is again carried out in a combination of one end of the partial path extracted with another end this time, three ends are changed as a whole. This is called 3-OPT. These are generally called k-OPT. In the k-OPT the value of k is preliminarily given. Therefore, the k-OPT had a problem that it was not sufficiently adaptable to the case wherein the optimum k value varied depending upon the initial solution to be improved. However, the LK method updates k in k-OPT (from 2) one by one as long as an improvement is made. Thus the LK method overcame the problem in the k-OPT method.

This embodiment applies the LK method, based on near-optimum solutions obtained by the NN method. Namely, the scan direction in each chip area is determined by the NN method. Specifically, the LK method is applied to the near-optimum solutions of the NN method given as initial solutions to search such an order of chip areas as to shorten the turnaround time. The LK method generates one improved solution for one initial solution. Since one improved solution is generated from one initial solution, a better result will be achieved with as many initial solutions as possible. The present embodiment employs an approach method for using the 3120 solutions obtained by the NN method as initial solutions and improving them.

It is, however, noted that in the "optimization of exposure sequence," which is the object of the invention, there are some cases that when a partial order in the exposure order of chip areas is inverted, the turnaround time is changed from that before the inversion. This means that the symmetry of order like the symmetric TSP is not guaranteed. It is thus noted that in the k-OPT method or the LK method, the turnaround time of exposure sequence in an inverted partial order must be recomputed every inversion.

When the LK method was applied to the all 1665 solutions in the forward search by the NN method, the computation time to obtain the 1665 solutions was 0.27 sec. Similarly, when the LK method was applied to the all 1455 solutions in the backward search by the NN method, the computation time for it was 0.144 sec. Namely, the computation time to obtain these 3120 solutions was about 0.414 sec. Since the computation time increases with increase in improved portions by the LK method, the computation time is not proportional simply to the number of initial solutions of objects. This experiment result showed that when the solutions (in the forward search) by the NN method were used as initial solutions in the LK method, the best solution was the one shown in FIG. 21 and that the overall turnaround time of the entire exposure sequence was 17.269 sec. The result also showed that when the solutions (in the backward search) by the NN method were used as initial solutions in the LK method, the best solution was the one shown in FIG. 22 and that the overall turnaround time of the entire exposure sequence was 17.128 sec.

Figure 23:
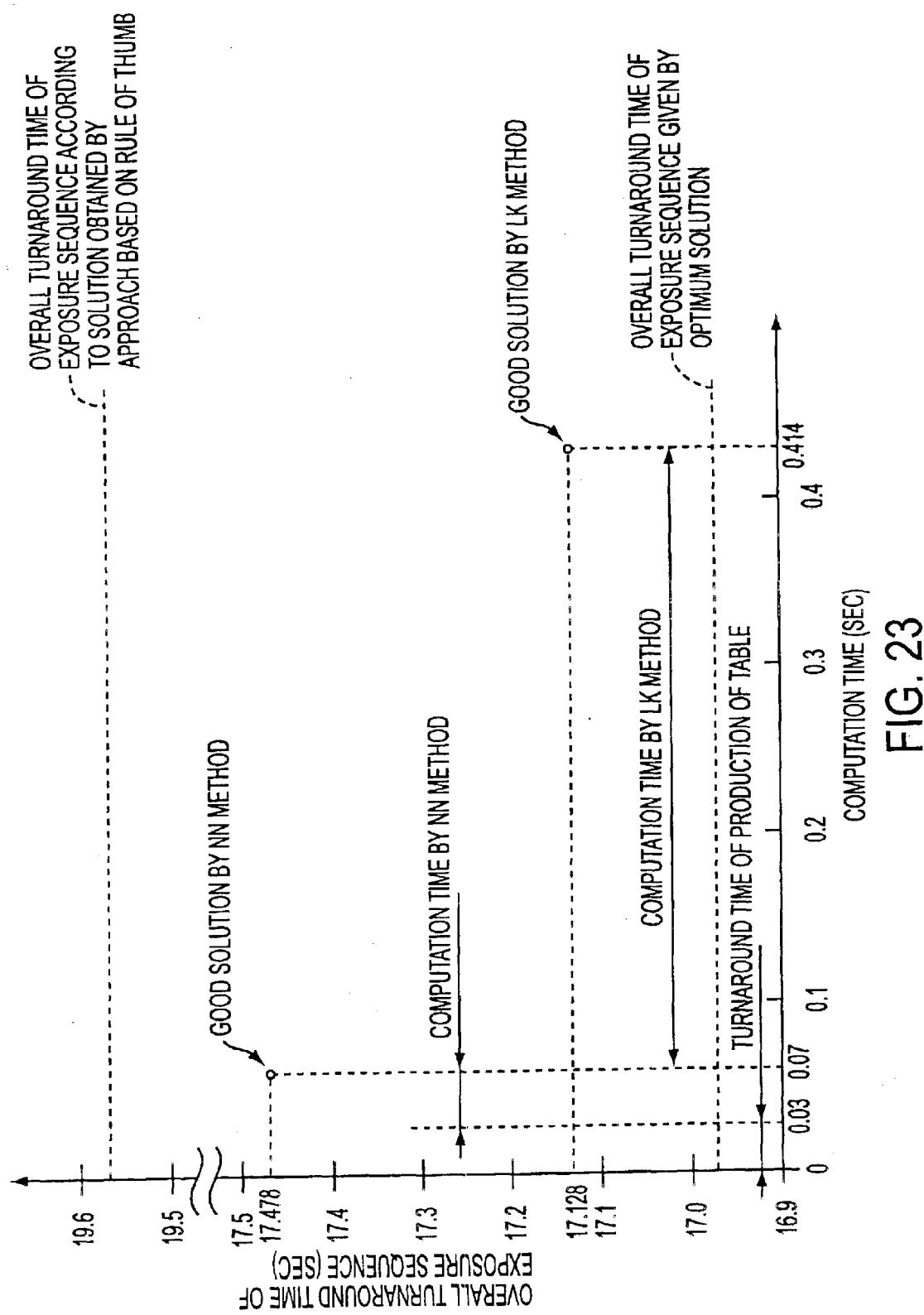
FIG. 23 is a drawing to show the relation among computation times and overall turnaround times of exposure sequence (total movement times of movement sequence) by the approach based on the rule of thumb, the NN method, and the LK method.
Figure 24:
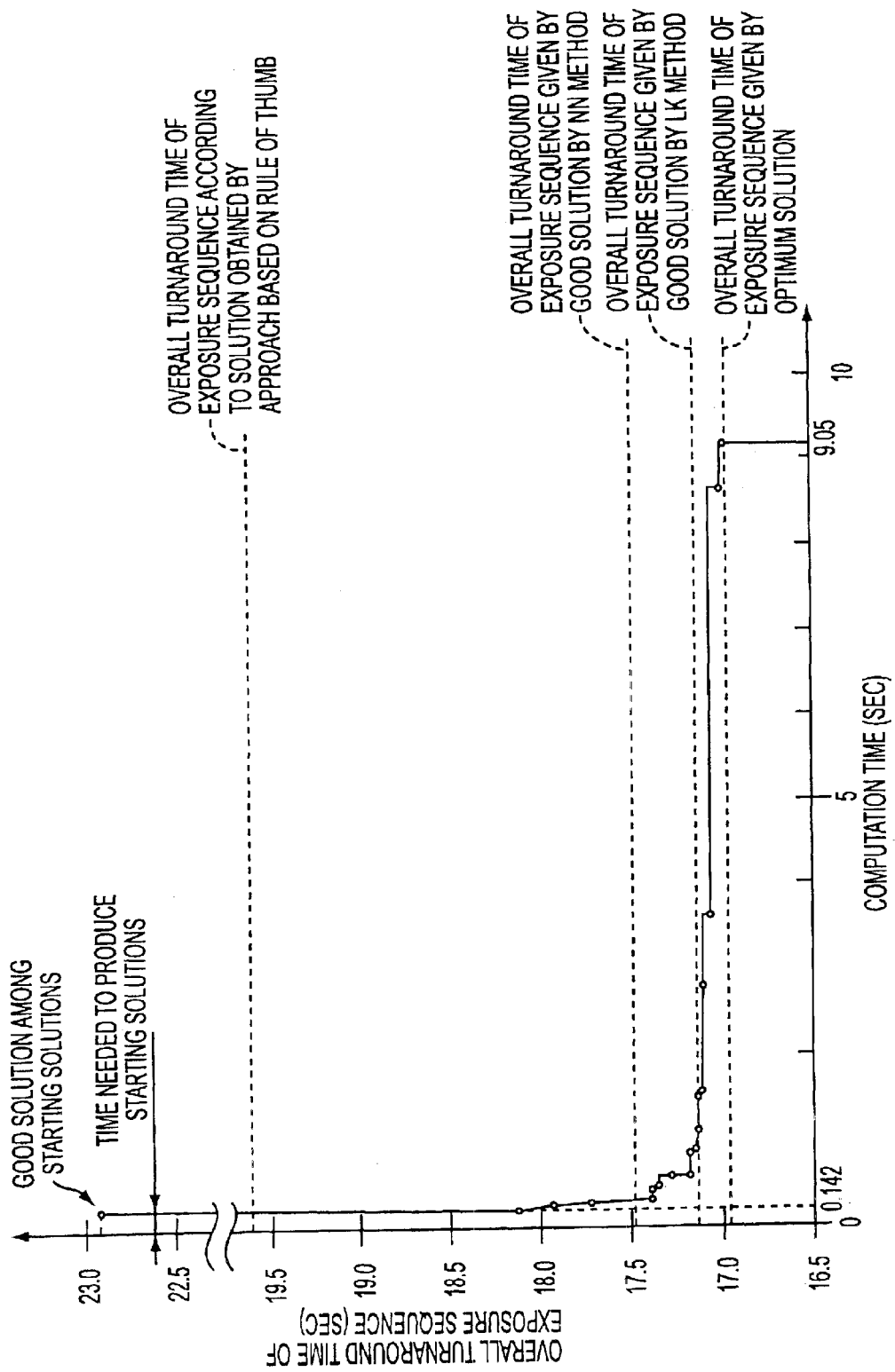
FIG. 24 is a drawing to show the relation among computation times and overall turnaround times of exposure sequence by the GA with a starting group of feasible basic solutions generated at random.
Figure 25:
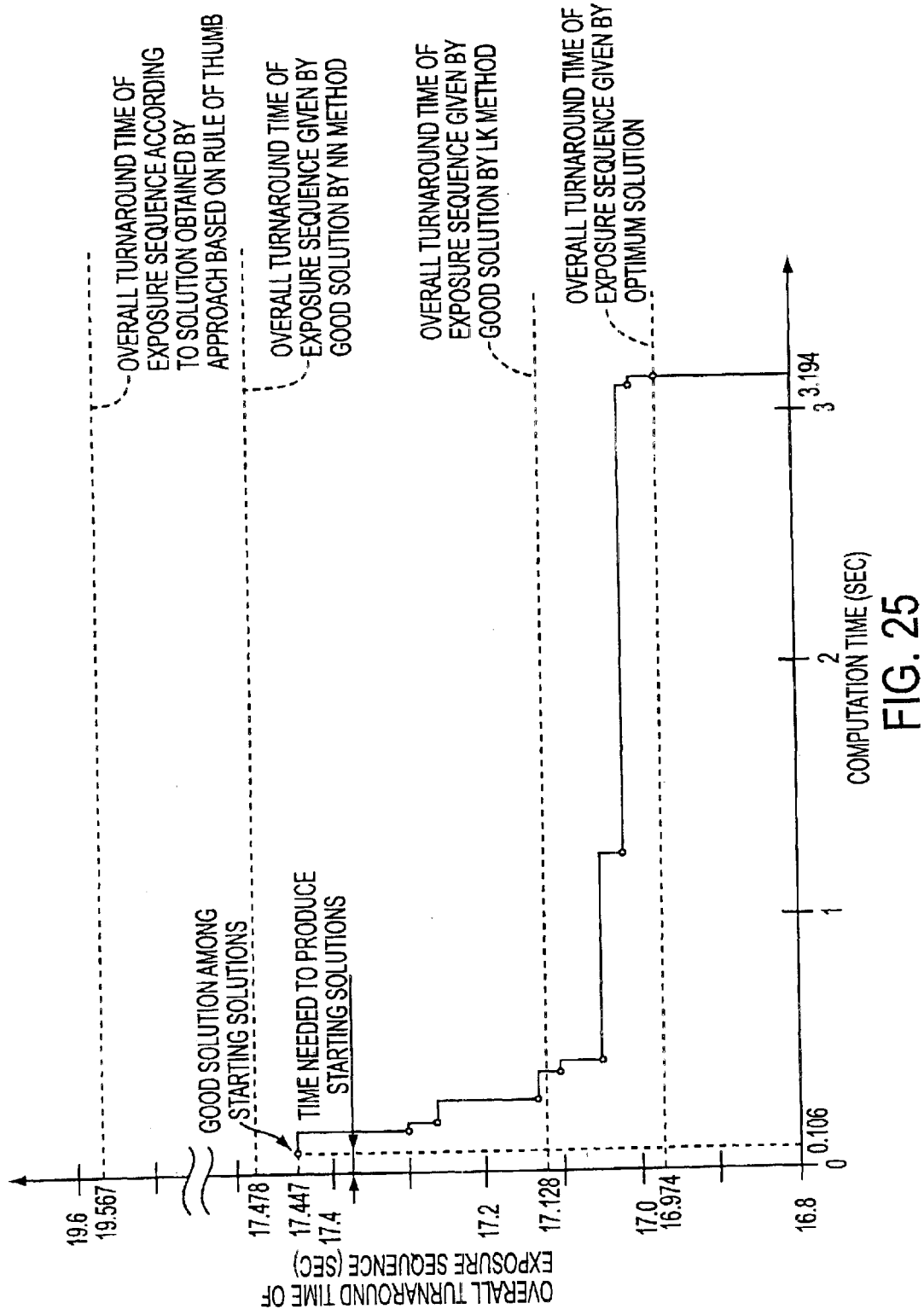
FIG. 25 is a drawing to show the relation among computation times and overall turnaround times of exposure sequence by the GA with a starting group of plural good solutions obtained by a combination method of the NN method with the LK method.

FIG. 23 to FIG. 25 show relations among the various approaches, computation times necessary for such approaches, and turnaround times of exposure sequences obtained by the approaches. The ordinate indicates the overall turnaround time of exposure sequence and the abscissa the computation time (in units of sec).

FIG. 23 illustrates the overall turnaround time of exposure sequence of the solution (movement sequence) obtained by the approach based on the rule of thumb, the time necessary for obtaining the best solution by the NN method and the overall turnaround time of the exposure sequence in the solution that time, and the computation time necessary for obtaining the good solution by the LK method using the best solution by the NN method as an initial solution and the overall turnaround time of the exposure sequence in the solution that time.

FIG. 24 shows the result achieved when the GA was applied to a starting group as a set of solutions consisting of the feasible basic solutions randomly generated as described above. Further, FIG. 25 shows the result achieved when the GA was applied to a starting group of a set of solutions consisting of the solutions obtained by the NN method+the LK method. It is apparent from either case (FIG. 24 and FIG. 25) that the best solution is updated with progress in alteration of generation. For comparison's sake, the both figures show the overall turnaround time of the exposure sequence of the solution obtained by the approach based on the rule of thumb, the overall turnaround time of the exposure sequence of the best solution obtained by the NN method, and the overall turnaround time of the exposure sequence of the best solution obtained by the LK method. The best solution obtained by the GA of FIG. 24 achieved the overall turnaround time of exposure sequence of 16.974 sec with consumption of the computation time of 9.05 sec. Similarly, the best solution obtained by the GA of FIG. 25 achieved the overall turnaround time of exposure sequence of 16.974 sec with consumption of the computation time of 3.194 sec.

Next, the following explanation is an example of determining an exposure sequence for a 12-inch wafer.

In the example, the number of chip areas to be exposed on the 12-inch wafer is 76. The coordinate (X,Y)of end point of wafer stage is (30, 350). Other parameters correspond to those of FIG. 4, and the size of chip area is also 25 mm (in the X-direction)×33 mm (in the Y-direction).

Figure 27:
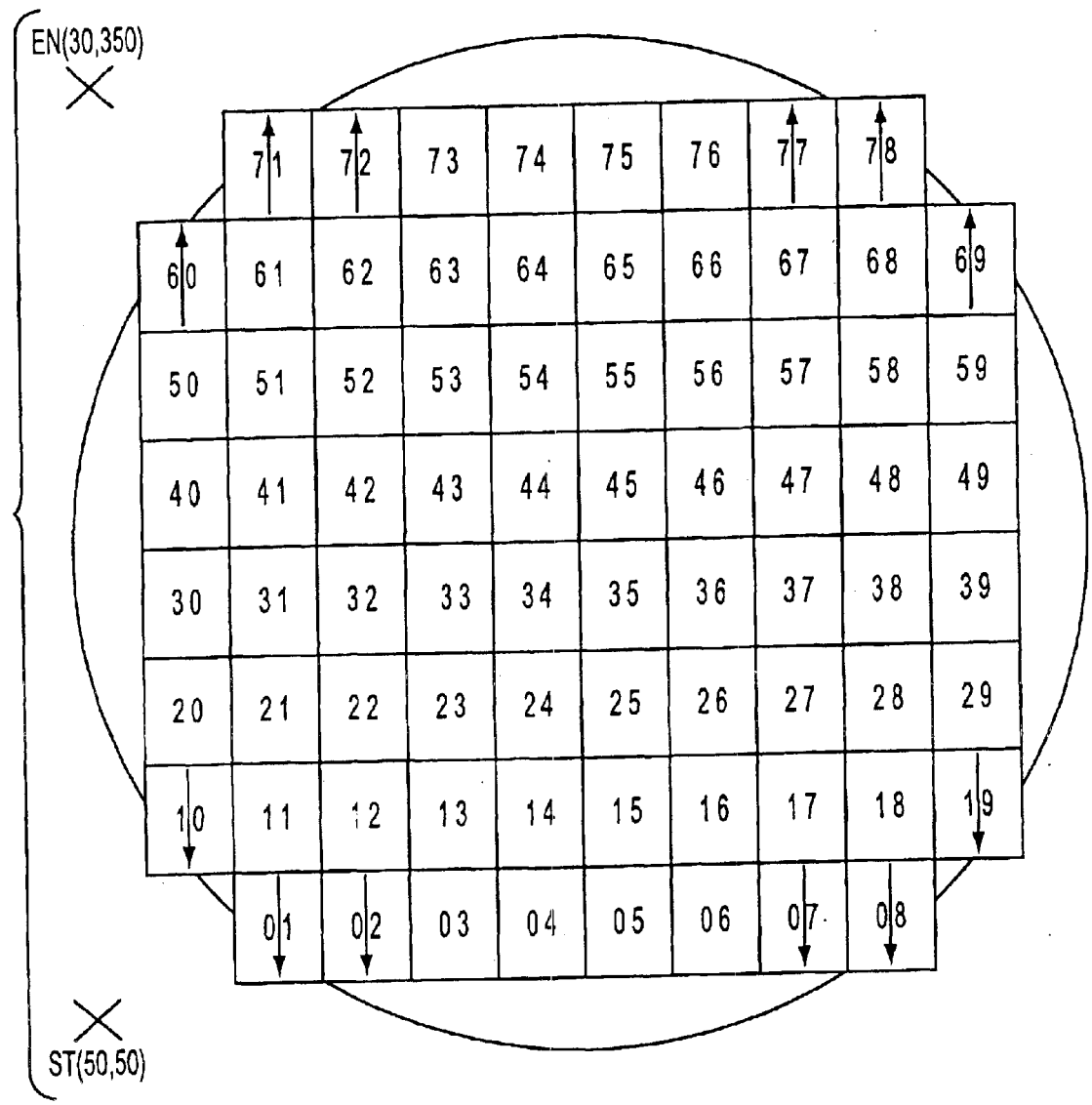
FIG. 27 is a drawing to show a surface of the wafer provided with the chip areas 01–78 (without 09 and 70) defined in the table of FIG. 26, illustrating constraints of scan direction in each chip area.

FIG. 26 is a table to show coordinates (X,Y: in units of mm) of the center of each of 76 chip areas denoted letters 01 to 78 (without 09 and 70) in the coordinate system on the 12-inch wafer and constraints on the scan direction in each chip area. The scan directions are indicated by three types of notations as the same of FIG. 5, forward by "fore", backward by "back", and no constraint by "any". Further, FIG. 27 is a drawing to show a surface of the wafer provided with the chip areas 01–78 defined in the table of FIG. 26.

Figure 28:
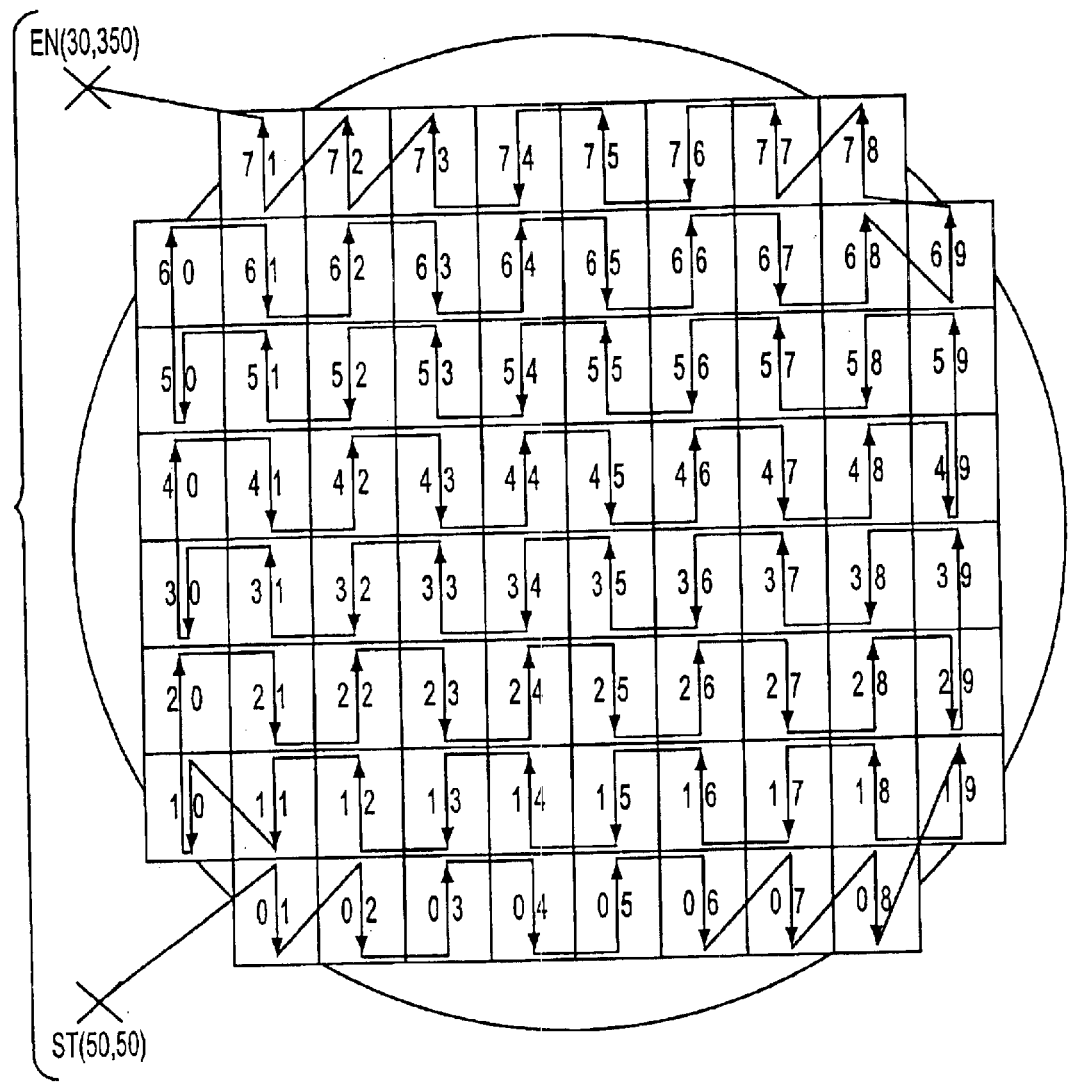
FIG. 28 is a drawing to show a movement sequence obtained by using the approach based on the rule of thumb.
Figure 29:
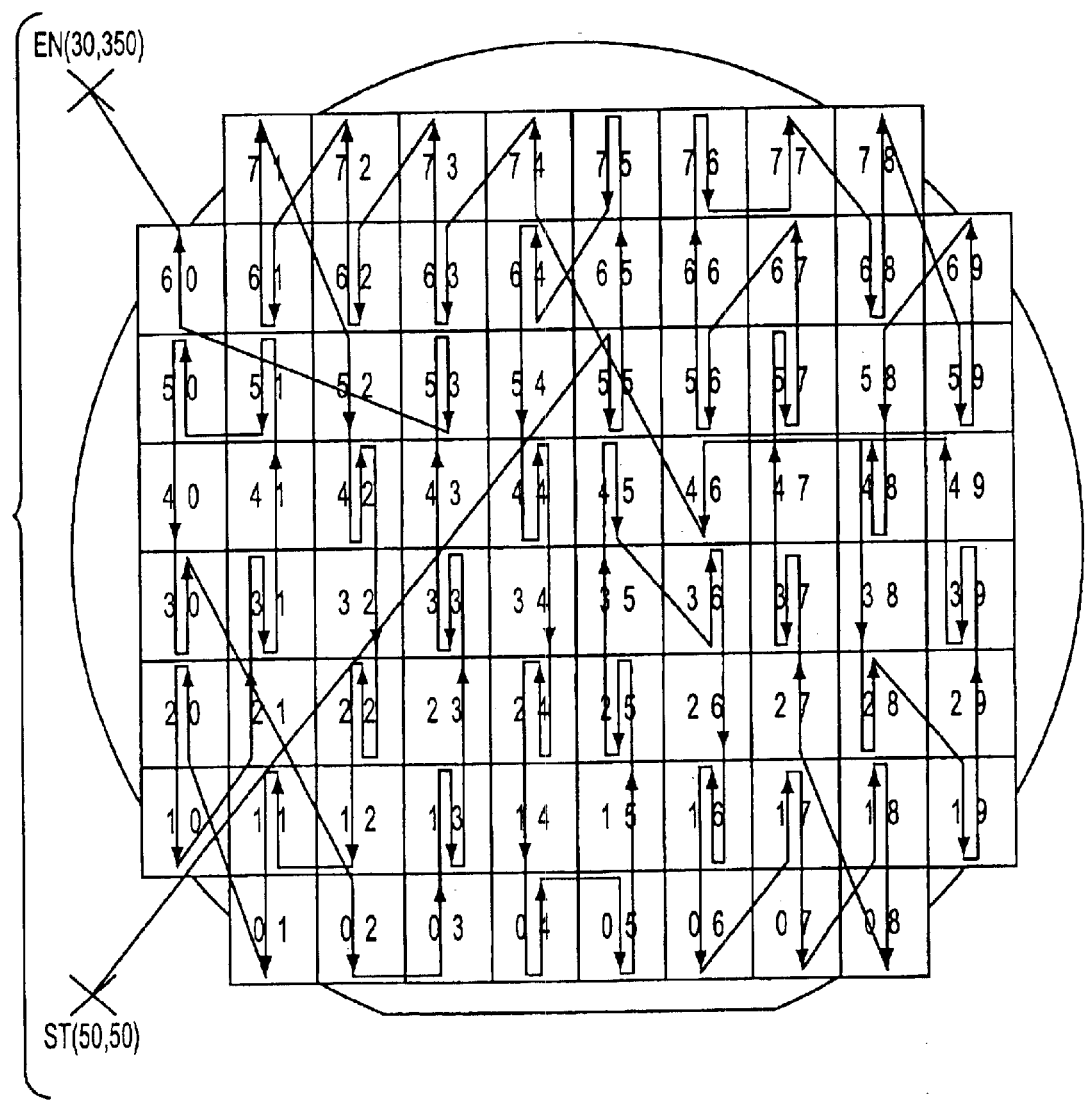
FIG. 29 is a drawing to show a good solution of the movement sequence obtained by using the NN method.
Figure 30:
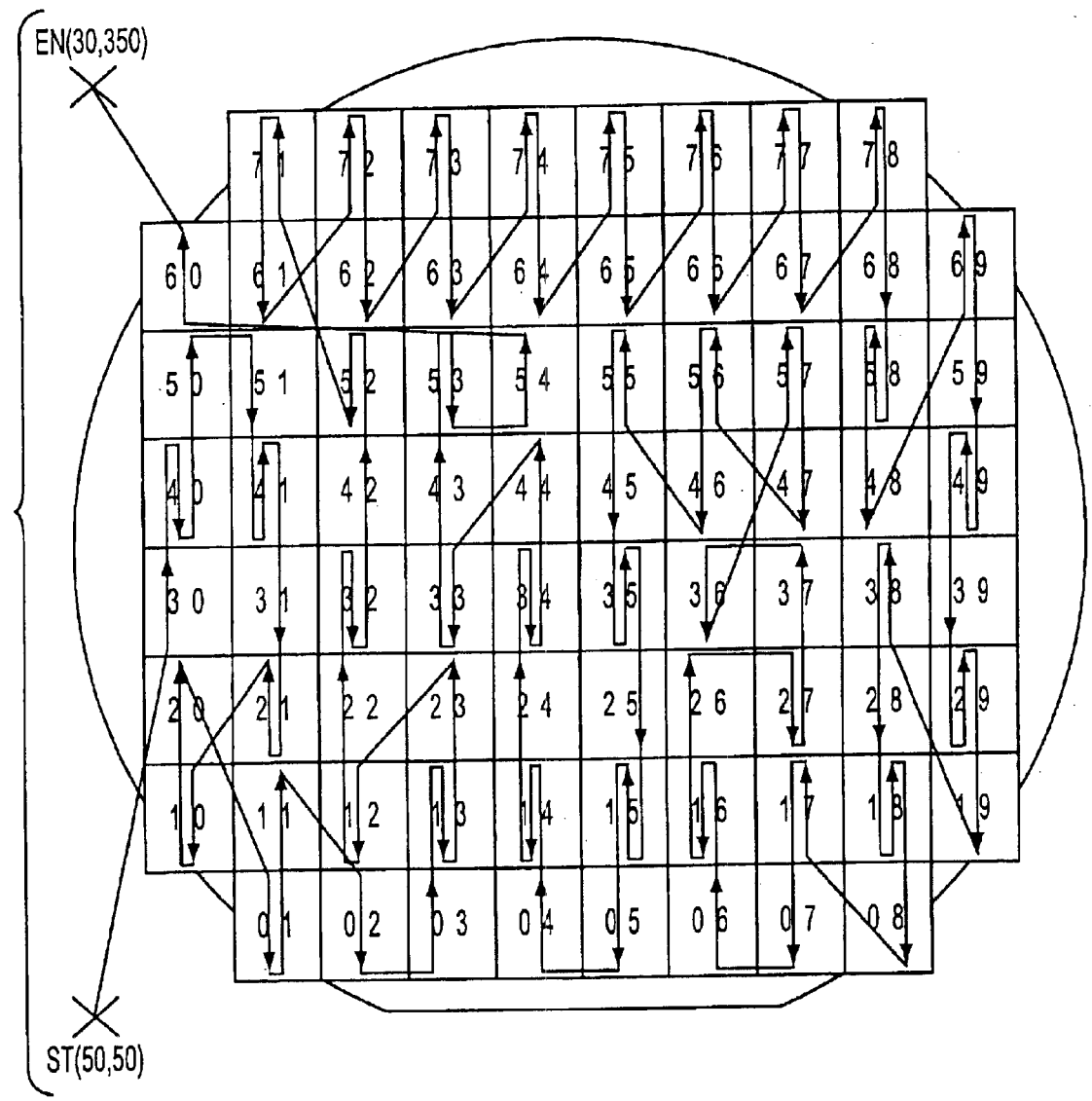
FIG. 30 is a drawing to show a good solution of the movement sequence obtained by using the LK method.
Figure 31:
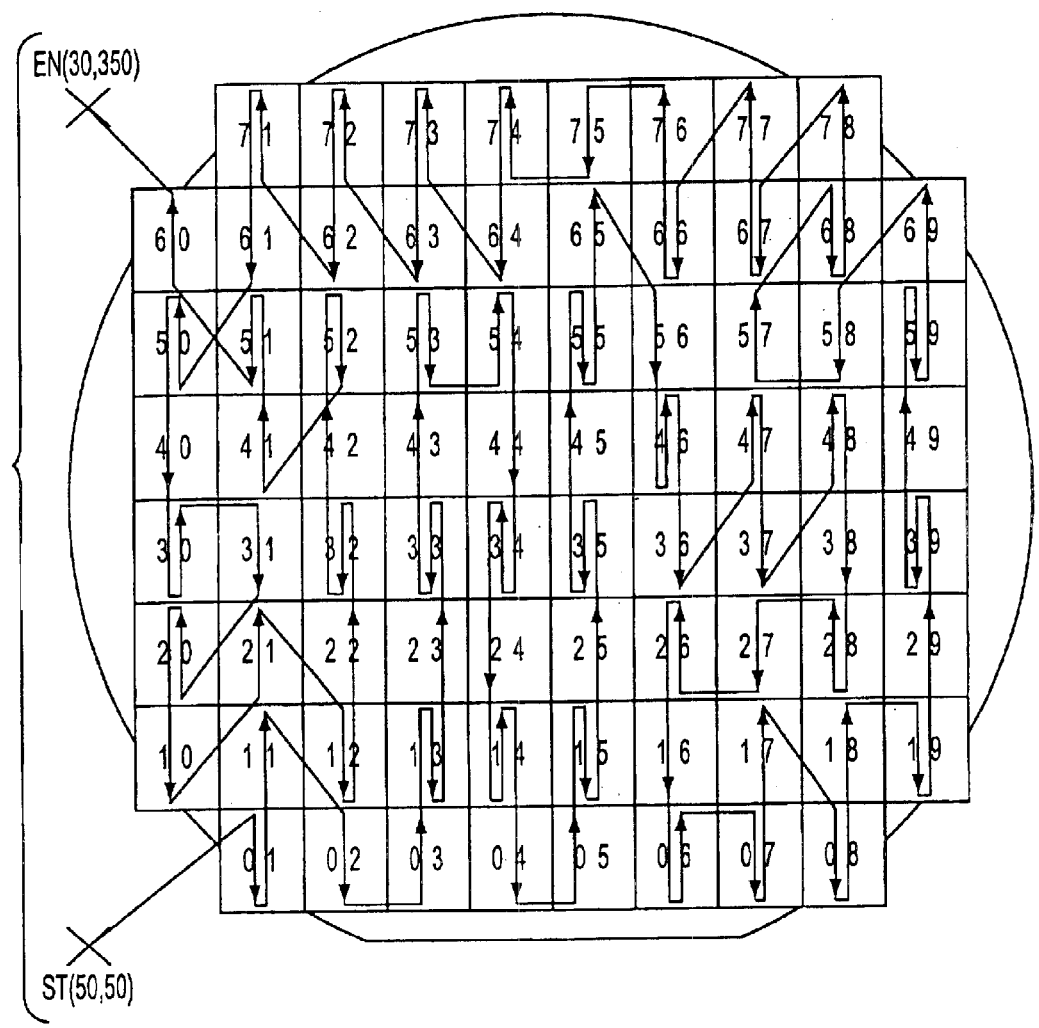
FIG. 31 is a drawing to show an optimum solution of the movement sequence obtained by the present invention.

FIG. 28 is a drawing to an exposure sequence obtained by using the approach based on the rule of thumb, and the overall turnaround time of the obtained exposure sequence was 55.189 sec. FIG. 29 is a drawing to show an exposure sequence obtained by using the NN method, and the overall turnaround time of the obtained exposure sequence was 50.306 sec. FIG. 30 is a drawing to show an exposure sequence obtained by using the LK method corresponding to FIG. 21, and the overall turnaround time of the obtained exposure sequence was 49.429 sec. Further, FIG. 31 is a drawing to show an exposure sequence obtained by using the approach of GA with an initial solution generated by the LK method, corresponding to FIG. 14.

The larger area to be performed an exposure as the 12-inch wafer, the more advantage of the method based on operations research technique and the approach of GA can be obtained as compared with the approach based on the rule of thumb. Further, in the comparison between the movement sequences for the 8-inch wafer as shown in FIGS. 14 to 22 and the movement sequences for the 12-inch wafer as shown in FIGS. 28 to 31, the following matter can be understood easily.

Here, in FIGS. 14 to 22, it is assumed that a group of the chip areas A to D is defined as a first line, a group of chip areas E to J is defined as a second line, and a group of the chip areas W to Z is defined as a fifth line, and that a group of the chip areas E, K and Q is defined as a first column, a group of the chip areas A, F, L, R and W is defined as a second column, and a group of the chip areas J, P and V is defined as a fifth column. Additionally, in FIGS. 28 to 31, it is assumed that a group of the chip areas 01 to 08 is defined as a first line, a group of the chip areas 10 to 19 is defined as a second line, and a group of the chip areas 71 to 78 is defined as an eighth line, and that a group of the chip areas 10, 20, 30, 40, 50 and 60 is defined as a first column, a group of the chip areas 01, 11, 21, 31, 41, 51, 61 and 71 is defined as a second column, and a group of the chip areas 19, 29, 39, 49, 59 and 69 is defined as a tenth column.

In this case, in FIGS. 15–18 and 28 that show sequences obtained by using the approach based on the rule of thumb, an exposure process is performed to the chip areas included in the (n+1) line after performing an exposure process to the chip areas included in the n line (n denotes natural number). On the other hand, in FIGS. 14, 19–22 and 29–31 that show sequences obtained by using the method based on operations research technique and the approach of GA, a feature that an exposure process is not performed to the chip areas included in the (n+1) line after performing an exposure process to the chip areas included in the n line is represented, for example exposure processes are continuously performed to one of the chip areas in the (n±1) line and one of the chip areas in the (n±2) line after performing an exposure process to one of the chip areas in the n line.

The above experiments were conducted on a workstation provided with an MPU of the clock frequency 200 MHz. It should be noted that the above computation times naturally differ depending upon the performance of the MPU or the like.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method for performing a predetermined process to all of a plurality of process areas rectilinearly arranged in an n-lines×n-rows matrix on a substrate, said method comprising:

performing said predetermined process to one of a first plurality of process areas in the n-line, said predetermined process illuminating said one of the first plurality of process areas with light while scanning said substrate within a two-dimensional plane; and performing said predetermined process to one of a second plurality of process areas which are arranged in a line different from said n-line, before completion of performing said predetermined process to all of the first plurality of process areas arranged in said n-line.

2. A method according to claim 1, wherein said predetermined process is an exposure process for exposing said one of the first or second process areas with a predetermined pattern.

3. A method for manufacturing a micro-device comprising a successively transferring a device-pattern onto a process area using an exposure process according to claim 2.

4. A method for performing a predetermined process to all of a plurality of process areas rectilinearly arranged in an n-lines×n-rows matrix on a substrate, said method comprising:

performing said predetermined process to a first process area in the n-line, said predetermined process illuminating said first process area with light while scanning said substrate within a two-dimensional plane;

performing said predetermined process to a second process area which is arranged in a line different from said n-line; and performing said predetermined process to a third process area which is arranged in the n-line and which is different from said first process area after completion of said performing said predetermined process to said first and second process areas.

5. A method according to claim 4, wherein said predetermined process is an exposure process for exposing one of said first through third process areas with a predetermined pattern.

6. A method for manufacturing a micro-device comprising successively transferring a device-pattern onto a process area using an exposure process according to claim 5.

7. A method for performing a process to all of a plurality of process areas rectilinearly arranged in an n-lines×n-rows matrix on a substrate, the method comprising:

performing the process to one of a first plurality of process areas in the n-row, the process illuminating the one of the first plurality of process areas with light while scanning the substrate within a two-dimensional plane; and performing the process to one of a second plurality of process areas which are arranged in a row different from the n-row, before completion of performing the process to all of the first plurality of process areas arranged in the n-row.

8. A method according to claim 7, wherein the process includes exposing the one of the first or second plurality of process areas with a pattern.

9. A method for manufacturing a micro-device comprising successively transferring a device-pattern onto the one of the first or second plurality of process areas using an exposure process according to claim 8.

10. A method for performing a process to all of a plurality of process areas rectilinearly arranged in an n-lines×n-rows matrix on a substrate, the method comprising:

performing the process to a first process area in the n-row, the process illuminating the first process area with light while scanning the substrate within a two-dimensional plane;

performing the process to a second process area which is arranged in a row different from the n-row; and performing the process to a third process area which is arranged in the n-row and which is different from the first process area after completion of said performing said process to said first and second process areas.

11. A method according to claim 10, wherein the process includes exposing a process area with a pattern.

12. A method for manufacturing a micro-device comprising successively transferring a device-pattern onto a process area using an exposure process according to claim 11.

13. A method for performing a process to each of a plurality of process areas arranged in a matrix on a substrate, the method comprising:

performing the process starting from one of the process areas not positioned along an outermost periphery of the matrix among the plurality of process areas, the process illuminating the one of the process areas with light while scanning the substrate within a two-dimensional plane.

14. A method according to claim 13, wherein the process includes exposing a process area with a pattern.

15. A method for manufacturing a micro-device comprising successively transferring a device pattern onto a process area using an exposure process according to claim 14.

16. A method for performing a process to each of a plurality of process areas arranged in a matrix on a substrate, the method comprising:

performing the process starting from one of the process areas on a line or row positioned on an outermost periphery of the matrix among the plurality of process areas and not positioned at an edge of the line or row, the process illuminating the one of the process areas with light while scanning the substrate within a two-dimensional plane.

17. A method according to claim 16, wherein the process includes exposing a process area with a pattern.

18. A method for manufacturing a micro-device comprising successively transferring a device-pattern onto a process area using an exposure process according to claim 17.

19. An exposure apparatus performing an exposure process transferring a pattern onto each of a plurality of process areas rectilinearly arranged in an n-lines×n-rows matrix on a substrate, the exposure apparatus comprising:

an exposure unit sequentially performing the exposure process on a first plurality of process areas, the exposure process including a scanning exposure process transferring the pattern to the first plurality of process areas while scanning the substrate in a two dimensional plane; and a control unit electrically connected to the exposure unit, the control unit performing the exposure process on one of a second plurality of process areas which are arranged in a line different from the n-line, before completion of performing the exposure process on all of the first plurality of process areas arranged in the n-line.

20. An exposure apparatus performing an exposure process transferring a pattern onto a plurality of process areas rectilinearly arranged in an n-lines×n-rows matrix on a substrate, the exposure apparatus comprising:

an exposure unit sequentially performing the exposure process on the plurality of process areas, the exposure process including a scanning exposure process transferring the pattern to the process areas while scanning the substrate in a two dimensional plane; and a control unit electrically connected to the exposure unit, the control unit performing the exposure process on each of first through third process areas in order from the first process area on the n-line, the second process area on a line different from the n-line, and the third process area on the n-line but different from the first process area.

21. An exposure apparatus performing an exposure process transferring a pattern onto a plurality of process areas rectilinearly arranged in an n-lines×n-rows matrix on a substrate, the exposure apparatus comprising:

an exposure unit sequentially performing the exposure process on the plurality of process areas, the exposure process including a scanning exposure process transferring the pattern to the plurality of process areas while scanning the substrate in a two dimensional plane; and a control unit electrically connected to the exposure unit, the control unit performing the exposure process on one of the process areas which is arranged in a row different from said n-row, before completion of performing the exposure process on all of the plurality of process areas arranged in the n-row.

22. An exposure apparatus performing an exposure process transferring a pattern onto a plurality of process areas rectilinearly arranged in an n-lines×n-rows matrix on a substrate, the exposure apparatus comprising:

an exposure unit sequentially performing the exposure process on the plurality of process areas, the exposure process including a scanning exposure process transferring the pattern to the process areas while scanning the substrate in a two dimensional plane; and a control unit electrically connected to the exposure unit, the control unit performing the exposure process on each of first to third process areas in order from the first process area on the n-row, the second process area on a row different from the n-row, and the third process area on the n-row but different from the first process area.

23. An exposure apparatus performing an exposure process transferring a pattern onto a plurality of process areas arranged in a matrix on a substrate, the exposure apparatus comprising:

an exposure unit sequentially performing the exposure process on the plurality of process areas, the exposure process including a scanning exposure process transferring the pattern to the process areas while scanning the substrate in a two dimensional plane; and a control unit electrically connected to the exposure unit, the control unit performing the exposure process starting from one of the process areas not positioned along an outermost periphery of the matrix among said plurality of process areas.

24. An exposure apparatus performing an exposure process transferring a pattern onto a plurality of process areas arranged in a matrix on a substrate, the exposure apparatus comprising:

an exposure unit sequentially performing the exposure process on the plurality of process areas, the exposure process including a scanning exposure process transferring the pattern to the process areas while scanning substrate in a two dimensional plane; and a control unit electrically connected to exposure unit, the control unit performing the exposure process starting from one of the process areas on a line or row positioned along an outermost periphery of the matrix among the plurality of process areas and not positioned at an edge of the line or row.

* * * * *

UNITED STATES PATENT AND TRADEMARK OFFICE
CERTIFICATE OF CORRECTION

PATENT NO. : 6,844,917 B2
DATED : January 18, 2005
INVENTOR(S) : Koji Yoshida

It is certified that error appears in the above-identified patent and that said Letters Patent is hereby corrected as shown below:

Column 30,
Line 45, delete "a" (first occurrence).

Signed and Sealed this

Ninth Day of August, 2005

JON W. DUDAS
*Director of the United States Patent and Trademark Office*